US012503587B2

(12) United States Patent
Hirotaki et al.

(10) Patent No.: US 12,503,587 B2
(45) Date of Patent: Dec. 23, 2025

(54) NOVOLAK RESIN, EPOXY RESIN, PHOTOSENSITIVE RESIN COMPOSITION, CURABLE RESIN COMPOSITION, CURED SUBSTANCE, ELECTRONIC DEVICE, PRODUCTION METHOD FOR NOVOLAK RESIN, AND PRODUCTION METHOD FOR EPOXY RESIN

(71) Applicant: Central Glass Company, Limited, Ube (JP)

(72) Inventors: Kensuke Hirotaki, Kawagoe (JP); Yukari Hara, Kawagoe (JP); Takashi Aoki, Kawagoe (JP); Hirokatsu Nagura, Kawagoe (JP); Kenji Hosoi, Kawagoe (JP)

(73) Assignee: Central Glass Company, Limited, Ube (JP)

( * ) Notice: Subject to any disclaimer, the term of this patent is extended or adjusted under 35 U.S.C. 154(b) by 474 days.

(21) Appl. No.: 17/914,885

(22) PCT Filed: Mar. 25, 2021

(86) PCT No.: PCT/JP2021/012741
§ 371 (c)(1),
(2) Date: Sep. 27, 2022

(87) PCT Pub. No.: WO2021/193878
PCT Pub. Date: Sep. 30, 2021

(65) Prior Publication Data
US 2023/0125986 A1  Apr. 27, 2023

(30) Foreign Application Priority Data

Mar. 27, 2020 (JP) ................................. 2020-057369
Apr. 27, 2020 (JP) ................................. 2020-078271
Sep. 30, 2020 (JP) ................................. 2020-164681

(51) Int. Cl.
*C08L 63/04* (2006.01)
*C08F 299/02* (2006.01)
*C08G 8/28* (2006.01)
*C08G 59/06* (2006.01)
*C08G 59/08* (2006.01)
*C08G 59/24* (2006.01)
*C08G 59/30* (2006.01)
*C08G 59/32* (2006.01)
*C08G 59/42* (2006.01)
*C08G 59/62* (2006.01)
*C08G 59/68* (2006.01)
*G03F 7/00* (2006.01)
*G03F 7/023* (2006.01)
*G03F 7/038* (2006.01)
*H05K 3/28* (2006.01)

(52) U.S. Cl.
CPC ............ *C08L 63/04* (2013.01); *C08G 59/245* (2013.01); *C08G 59/308* (2013.01); *C08L 2203/20* (2013.01)

(58) Field of Classification Search
None
See application file for complete search history.

(56) References Cited

U.S. PATENT DOCUMENTS

| 6,451,879 | B1 | 9/2002 | Mori et al. |
| 9,746,768 | B2 | 8/2017 | Ohnishi et al. |
| 9,984,878 | B2 | 5/2018 | Hatakeyama et al. |
| 2001/0003759 | A1 | 6/2001 | Sato et al. |
| 2002/0182541 | A1 | 12/2002 | Gonsalves |
| 2006/0088787 | A1 | 4/2006 | Gonsalves et al. |
| 2006/0121390 | A1 | 6/2006 | Gonsalves |
| 2007/0117043 | A1 | 5/2007 | Gonsalves |
| 2008/0096131 | A1 | 4/2008 | Hatakeyama et al. |

(Continued)

FOREIGN PATENT DOCUMENTS

| CN | 1320132 A | 10/2001 |
| CN | 104327674 A | 2/2015 |

(Continued)

OTHER PUBLICATIONS

Chinese-language Office Action issued in Chinese Application No. 202180024933.2 dated Sep. 28, 2023 (11 pages).
International Search Report (PCT/ISA/210) issued in PCT Application No. PCT/JP2021/012741 dated Jun. 15, 2021 with English translation (four (4) pages).
Japanese-language Written Opinion (PCT/ISA/237) issued in PCT Application No. PCT/JP2021/012741 dated Jun. 15, 2021 (three (3) pages).

(Continued)

*Primary Examiner* — Ha S Nguyen
(74) *Attorney, Agent, or Firm* — Crowell & Moring LLP

(57) ABSTRACT

A novolak resin including a partial structure represented by —C(CF$_3$)H—. In addition, there are provided a photosensitive resin composition containing the above-described novolak resin and a photosensitizing agent. In addition, there is provided an epoxy resin having a partial structure represented by —C(CF$_3$)H—. In addition, there is provided a curable resin composition containing the novolak resin or the epoxy resin. In addition, there is provided a cured substance obtained by curing the composition. In addition, there is provided a production method for a novolak resin, including reacting an aromatic compound with fluoral in a presence of an acid catalyst to produce a novolak resin having a partial structure represented by —C(CF$_3$)H—. Further, there is provided a production method for an epoxy resin, including an epoxidation step of reacting a novolak resin having a partial structure represented by —C(CF$_3$)H— with epihalohydrin in a presence of a base.

14 Claims, No Drawings

(56) References Cited

U.S. PATENT DOCUMENTS

| | | |
|---|---|---|
| 2008/0119566 A1 | 5/2008 | Baker |
| 2015/0362835 A1 | 12/2015 | Ohnishi et al. |
| 2016/0342088 A1 * | 11/2016 | Hatakeyama ............ C08G 8/04 |
| 2020/0353735 A1 | 11/2020 | Ogino et al. |

FOREIGN PATENT DOCUMENTS

| | | | |
|---|---|---|---|
| CN | 104513358 A | | 4/2015 |
| EP | 274203 A | * 7/1988 | ............ C08G 16/02 |
| JP | 61-111319 A | | 5/1986 |
| JP | 64-45423 A | | 2/1989 |
| JP | 2002-198283 A | | 7/2002 |
| JP | 2002-303974 A | | 10/2002 |
| JP | 2006-52366 A | | 2/2006 |
| JP | 2017-102420 A | | 6/2017 |
| JP | 6206445 B2 | | 10/2017 |
| JP | 6319582 B2 | | 5/2018 |
| JP | 6502885 B2 | | 4/2019 |
| KR | 10-2012-0128563 A | | 11/2012 |
| KR | 10-2015-0040752 A | | 4/2015 |
| TW | 200839436 A | | 10/2008 |
| WO | WO 02/073308 A1 | | 9/2002 |
| WO | WO 2008/008492 A2 | | 1/2008 |
| WO | 2019/026582 A1 | | 2/2019 |
| WO | WO 2019/088103 A1 | | 5/2019 |

OTHER PUBLICATIONS

Extended European Search Report issued in European Application No. 21775123.9 dated Mar. 26, 2024 (7 pages).
Korean-language Notice of Allowance issued in Korean Application No. 10-2022- 7037349 dated Oct. 14, 2025 (5 pages).

* cited by examiner

NOVOLAK RESIN, EPOXY RESIN, PHOTOSENSITIVE RESIN COMPOSITION, CURABLE RESIN COMPOSITION, CURED SUBSTANCE, ELECTRONIC DEVICE, PRODUCTION METHOD FOR NOVOLAK RESIN, AND PRODUCTION METHOD FOR EPOXY RESIN

TECHNICAL FIELD

The present invention relates to a novolak resin, an epoxy resin, a photosensitive resin composition, a curable resin composition, a cured substance, an electronic device, a production method for a novolak resin, and a production method for an epoxy resin.

BACKGROUND ART

A fluorine-based resin may be used for the manufacture of electronic devices.

As an example, Patent Document 1 describes a resist upper layer film forming composition for lithography, containing a fluorine-containing resin.

As another example, Patent Document 2 describes a resin substrate for a circuit board, containing a polymer having a fluorine atom.

As still another example, Patent Document 3 describes a resist underlayer film material containing a fluorine-containing novolak resin.

RELATED DOCUMENT

Patent Document

[Patent Document 1] Japanese Patent No. 6319582
[Patent Document 2] Japanese Patent No. 6206445
[Patent Document 3] Japanese Patent No. 6502885

SUMMARY OF THE INVENTION

Technical Problem

The inventors of the present invention have studied to achieve one object to provide a fluorine-containing resin that can be preferably used for the manufacture of an electronic device.

Solution to Problem

As a result of the study, the inventors of the present invention have completed the following first invention and second invention.

The first invention is as follows.

A novolak resin including a partial structure represented by —$C(CF_3)H$—.

In addition, according to the present invention, there is provided a photosensitive resin composition containing the above-described novolak resin and a photosensitizing agent.

The second invention is as follows.

An epoxy resin including a partial structure represented by —$C(CF_3)H$—.

In addition, according to the present invention, there is provided a curable resin composition containing at least one of the novolak resin of the first invention or the epoxy resin of the second invention.

In addition, according to the present invention, there is provided a cured substance obtained by curing the above-described curable resin composition.

In addition, according to the present invention, there is provided an electronic device containing the above-described cured substance.

In addition, according to the present invention, there is provided a production method for a novolak resin, including reacting an aromatic compound with fluoral in a presence of an acid catalyst to produce a novolak resin having a partial structure represented by —$C(CF_3)H$—.

In addition, according to the present invention, there is provided a production method for an epoxy resin, including an epoxidation step of reacting a novolak resin having a partial structure represented by —$C(CF_3)H$— with epihalohydrin in a presence of a base.

According to the present invention, there is provided a fluorine-containing resin that can be preferably used for the manufacture of an electronic device.

DESCRIPTION OF EMBODIMENTS

Hereinafter, embodiments of the present invention will be described in detail.

In the present specification, the description "X to Y" in the description of a numerical range represents X or more and Y or less unless specified otherwise. For example, "1% to 5% by mass" means "1% by mass or more and 5% by mass or less".

In the present specification, the description "group (atomic group)" includes both a group not having a substituent and a group having a substituent unless specified that the group is substituted or unsubstituted. For example, "alkyl group" includes not only an alkyl group not having a substituent (an unsubstituted alkyl group) but also an alkyl group having a substituent (a substituted alkyl group).

The description "(meth)acryl" in the present specification represents a concept including both acryl and methacryl. The same applies to the similar description such as "(meth) acrylate".

Unless otherwise specified, the term "organic group" in the present specification means an atomic group obtained by removing one or more hydrogen atoms from an organic compound. For example, the "monovalent organic group" represents an atomic group obtained by removing one hydrogen atom from any organic compound.

In the chemical formulae in the present specification, the notation "Me" represents a methyl group ($CH_3$).

In the present specification, the term "fluoral" means trifluoroacetaldehyde.

The "novolak resin" in the present specification includes not only those in which the raw material is a phenolic compound in which a monocyclic aromatic ring such as phenol or cresol is substituted with a hydroxy group, but also, for example, those in which the raw material is a phenolic compound in which a polycyclic aromatic ring such as hydroxynaphthalene is substituted with a hydroxy group. In addition, the novolak resin in the present specification includes not only those obtained by reacting a phenolic compound with formaldehyde but also those obtained by reacting a phenolic compound with each of various aldehydes (specifically, fluoral and the like). In addition, in the present specification, a part or all of the hydrogen atom of the phenolic hydroxyl group in the novolak resin may be substituted with a group other than the hydrogen atom.

Further, in the present specification, the novolak resin may include those having no phenolic hydroxyl group.

The term "electronic device" in the present specification is used to include elements, devices, final products, and the like, to which electronic engineering technologies in semiconductor chips, semiconductor devices, printed wiring boards, electric circuits, display devices, information and communication terminals, light emitting diodes, physical batteries, and chemical batteries, and the like have been applied.

In the present specification, the embodiment of the first invention may be described as a first embodiment, and the embodiment of the second invention may be described as a second embodiment.

There is a commonality between the novolak resin of the first invention and the epoxy resin of the second invention in that they have a partial structure represented by "aromatic ring —C(CF$_3$)H— aromatic ring". Since they have such a partial structure, the transmittance of light (a g-line, an i-line, an h-line, and the like) that is often used in the manufacture of electronic devices and the solubility in an alkali developer are good.

First Embodiment

<Novolak Resin>

The novolak resin of the first embodiment has a partial structure represented by —C(CF$_3$)H—.

As one example, the novolak resin of the first embodiment has good transmittance of light (a g-line, an i-line, an h-line, and the like) that is often used in the manufacture of electronic devices. This is conceived to be because the novolak resin of the first embodiment contains a fluorine atom which has an electron-withdrawing property (it is conceived to be because the C—F bond is difficult to absorb light such as a g-line, an i-line, and an h-line as compared with the C—H bond).

Further, as another example, the novolak resin of the first embodiment has good solubility in an alkali developer that is often used in the production of electronic devices, although it contains a fluorine atom that generally exhibits hydrophobicity (hereinafter, the solubility in an alkali developer is also simply referred to as the "alkali solubility"). The novolak resin of the first embodiment has an asymmetric structure of —C(CF$_3$)H—, and thus it is conceived that the contribution due to the high electron-withdrawing property of the fluorine atom and the bent polymer structure is large, although the mechanism thereof is not clear. It is presumed that this is related to good alkali solubility.

In addition, providing a fluorine atom in the structural unit brings advantages in the use application to imprint. As a property required for a general imprint resin, it is expected that the adhesiveness to a metal mold is low. In a case where a fluorine atom is provided in the structural unit in the first embodiment, the adhesiveness to a mold can be reduced.

Hereinafter, the description related to the novolak resin of the first embodiment will be continued.

The novolak resin of the first embodiment preferably has a structural unit represented by General Formula (1). In particular, in a case where n=0 in General Formula (1), the above-described light transmittance is good.

[Chemical 1]

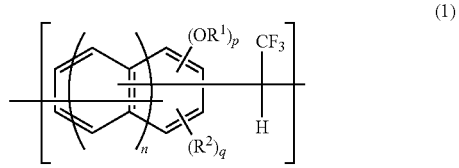

In General Formula (1),

R$^1$ represents a hydrogen atom or a monovalent organic group, and in a case where a plurality of R$^1$'s are present, the plurality of R$^1$'s may be the same or different from each other, R$^2$ represents a monovalent substituent, and in a case where a plurality of R$^2$'s are present, the plurality of R$^2$'s are may be the same or different from each other, n is 0 to 2, and p is 1 or more, and q is 0 or more, provided that in a case where n is 0, p+q≤4 is satisfied, in a case where n is 1, p+q≤6 is satisfied, and in a case where n is 2, p+q≤8 is satisfied.

(Description of General Formula (1))

In a case where R$^1$ is a monovalent organic group, examples of the monovalent organic group include an alkyl group, a cycloalkyl group, an aryl group, an alkenyl group, an alkynyl group, and a cyano group. Any carbon of these groups may be substituted with any number and any combination of substituents such as a halogen atom, an alkoxy group, and a haloalkoxy group.

In a case where R$^1$ is a monovalent organic group, the number of carbon atoms of the monovalent organic group is, for example, 1 to 20, and it is preferably 1 to 10.

R$^1$ is preferably a hydrogen atom or an alkyl group, and it is more preferably a hydrogen atom. The alkyl group is preferably a linear or branched alkyl group having 1 to 6 carbon atoms. Among the above, it is preferably an n-butyl group, an s-butyl group, an isobutyl group, a t-butyl group, an n-propyl group, an i-propyl group, an ethyl group, or a methyl group, and particularly preferably an ethyl group or a methyl group.

From the viewpoint of alkali solubility, R$^1$ is preferably a hydrogen atom (in a case where p is 2 or more, at least one R$^1$ is preferably a hydrogen atom).

Examples of the monovalent substituent as R$^2$ include an alkyl group, an alkoxy group, a cycloalkyl group, an aryl group, an alkenyl group, an alkynyl group, an aryloxy group, an amino group, an alkylamino group, an arylamino group, a cyano group, a nitro group, a silyl group, and a halogeno group (for example, a fluoro group or the like). These groups may further have a substituent such as a fluorine atom or a carboxyl group.

R$^2$ is preferably an alkyl group, an alkoxy group, a fluorinated alkyl group (for example, a trifluoromethyl group), a halogeno group (for example, a fluoro group), or a nitro group. Among the above, R$^2$ is preferably an alkyl group. Specific examples of the alkyl group include the same ones as those described as the alkyl group as R$^1$.

It suffices that n is 0 to 2; however, n is preferably 0. n is preferably 0 or 1, for example, from the viewpoint of the transmittance of light (a g-line, an i-line, an h-line, and the like) that is often used in the manufacture of electronic devices. In a case of considering an electronic device in a broad sense, n=1 may be good from the viewpoint of heat resistance, for example, in a case of an underlayer film.

p is 1 or more, and q is 0 or more. However, in a case where n is 0, p+q≤4 is satisfied, in a case where n is 1, p+q≤6 is satisfied, and in a case where n is 2, p+q≤8 is satisfied.

As described above, n is preferably 0.

From the viewpoints of ease of preparation of raw materials and cost, p is preferably 1.

From the viewpoint of ease of preparation of raw materials and cost, q is preferably 0 to 2, more preferably 0 or 1, and still more preferably 0.

The preferred aspect of the structural unit of the novolak resin having a partial structure represented by —C(CF$_3$)H— includes structural units represented by General Formulae (8) to (11).

[Chemical 2]

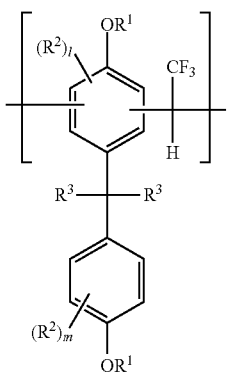

(8)

[Chemical 3]

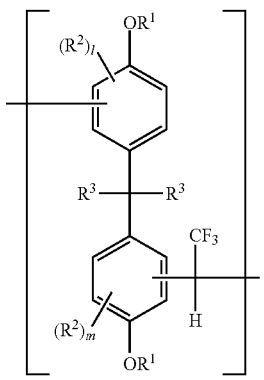

(9)

[Chemical 4]

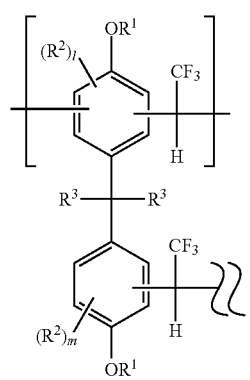

(10)

[Chemical 5]

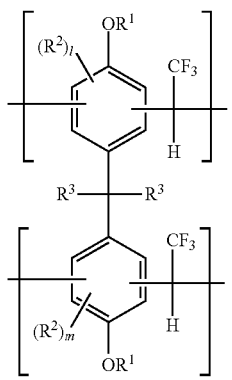

(11)

In General Formulae (8) to (11), $R^1$ represents a hydrogen atom or a monovalent organic group, and in a case where a plurality of $R^1$'s are present, the plurality of $R^1$'s may be the same or different from each other, $R^2$ represents a monovalent substituent, and in a case where a plurality of $R^2$'s are present, the plurality of $R^2$'s are may be the same or different from each other, examples of $R^1$ and $R^2$ are the same as the examples of $R^1$ and $R^2$ in General Formula (1), l and m are each independently 0 to 3, $R^3$ represents a hydrogen atom, an alkyl group, an alkenyl group, or an aryl group, these groups may be further substituted with a fluorine atom, and $R^3$ may be linked to form a cyclic group having 3 to 10 carbon atoms, the cyclic group being saturated or unsaturated, and monocyclic or polycyclic, and in a case where a plurality of $R^3$'s are present, the plurality of $R^3$'s are may be the same or different from each other.

Further, $R^1$ preferably contains a polymerizable carbon-carbon double bond. This is because the polymerizable carbon-carbon double bonds are bonded to each other by radical polymerization to form a crosslinking structure between the molecular chains, whereby the curability by light or heat is increased.

Further, $R^1$ is preferably a partial structure represented by General Formula (12).

[Chemical 6]

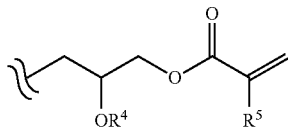

(12)

In General Formula (12), $R^4$ represents a hydrogen atom or a monovalent organic group, and $R^5$ represents a hydrogen atom, a methyl group, or a fluorine atom.

Providing this partial structure is preferable from the viewpoint of synthesis.

Further, $R^1$ is still more preferably a group in which $R^4$ in the partial structure represented by General Formula (12) has a terminal carboxy group. The presence of a terminal carboxy group has an effect of increasing developability.

The preferred aspect of the partial structure represented by —C(CF$_3$)H— as described includes structural units represented by General Formulae (13) to (15) and other listed structural units. In the listed structural units, the definitions of $R^1$ to $R^5$ are the same as those in General Formulae (8) to (12).

It is surely noted that the novolak resin of the first embodiment may have two or more partial structures which are different structures from each other. For example, the novolak resin of the first embodiment may have two or more structural units among the structural units of General Formulae (13) to (15) shown below and other listed structural units. Of course, the novolak resin of the first embodiment may be composed of only one structural unit.

Further, the novolak resin of the first embodiment may contain a partial structure represented by —C(CF$_3$)H— and a partial structure that is not represented by —C(CF$_3$)H—.

[Chemical 7]

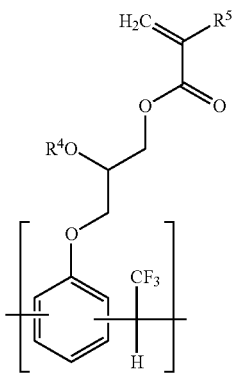
(13)

[Chemical 87]

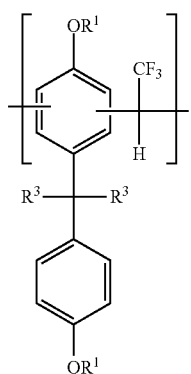
(14)

[Chemical 9]

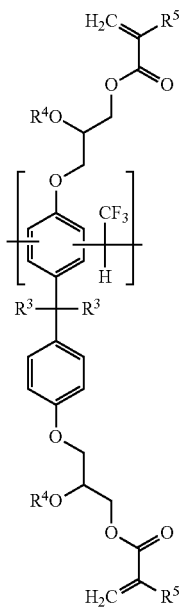
(15)

The preferred aspect of the structural unit represented by General Formula (1) includes structural units represented by Formulae (2) to (6) and other listed structural units. Among the listed structural units, the definitions of p and q are the same as those of General Formula (1).

It is surely noted that although the novolak resin of the first embodiment applies to General Formula (1), it may have two or more structural units which are different structures from each other. For example, the novolak resin of the first embodiment may have two or more structural units among the structural units of Formulae (2) to (6) listed below and other listed structural units. Of course, the novolak resin of the first embodiment may be composed of only one structural unit.

Further, the novolak resin of the first embodiment may include a structural unit that applies to General Formula (1) and a structural unit that does not apply to General Formula (1).

[Chemical 10]

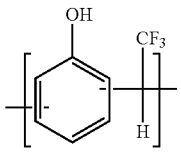
(2)

[Chemical 11]

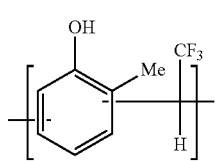
(3)

-continued
[Chemical 12]
(4)
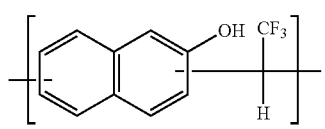
[Chemical 13]
(5)
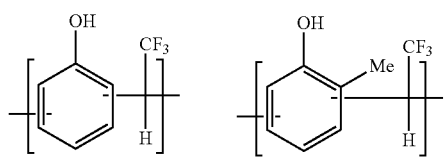
[Chemical 14]
(6)
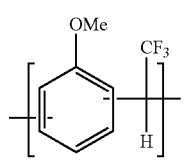
[Chemical 15]
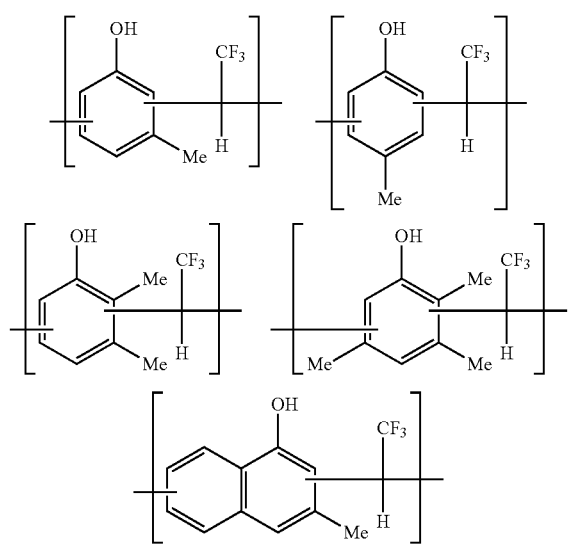
[Chemical 16]
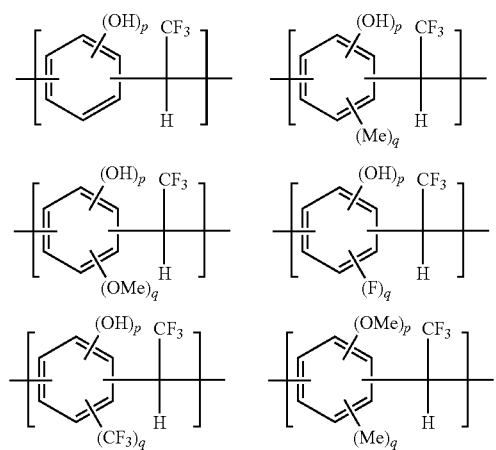
-continued
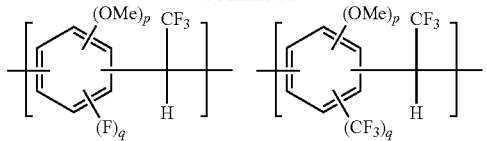
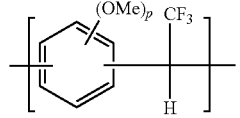
[Chemical 17]
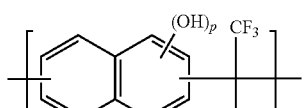
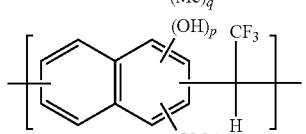
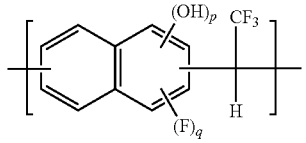
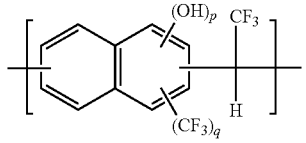
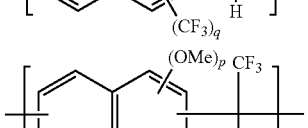
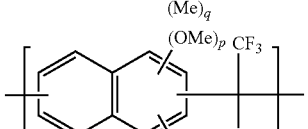
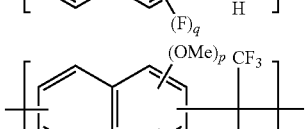
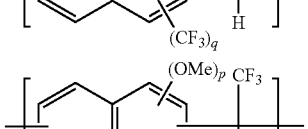
[Chemical 18]
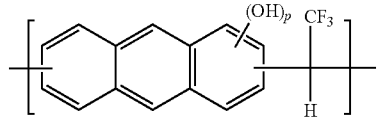

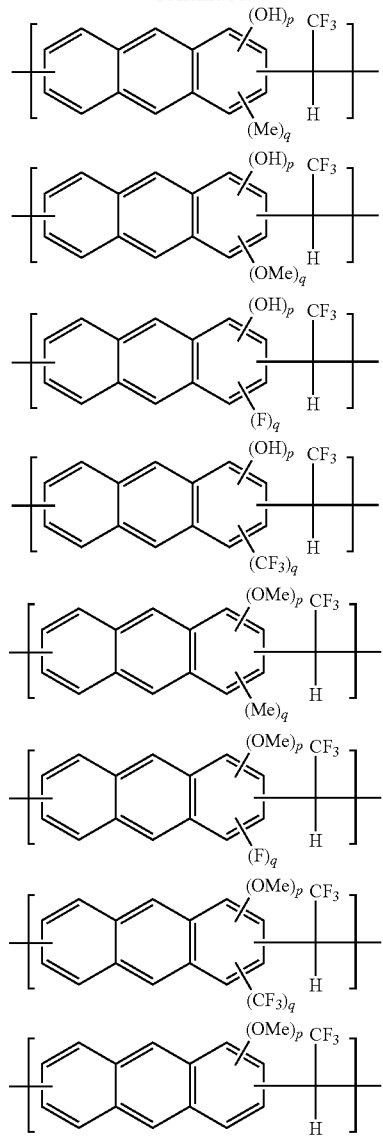

[Chemical 19]

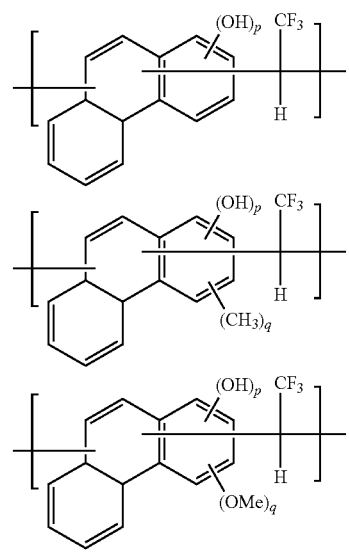

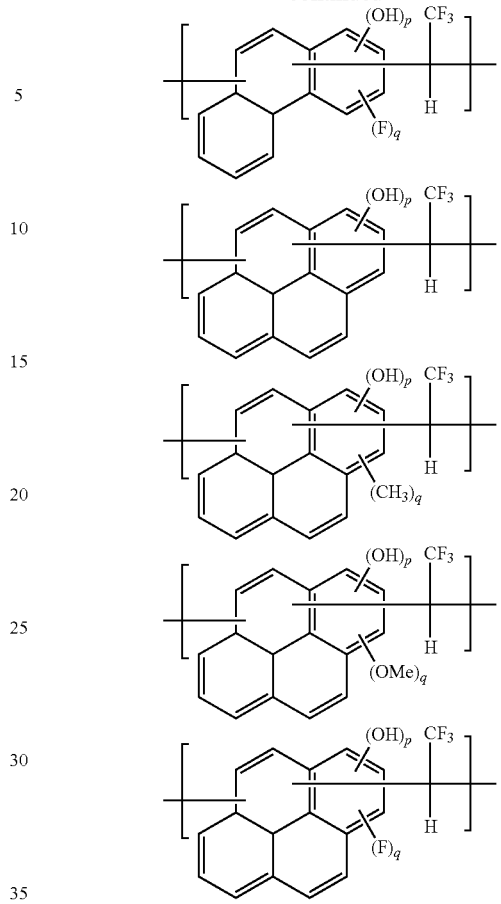

(Molecular Weight and Dispersivity)

The weight average molecular weight of the novolak resin of the first embodiment is preferably 300 to 200,000, more preferably 300 to 150,000, and still more preferably 300 to 100,000. In a case of adjusting the weight average molecular weight, it is possible to adjust the alkali solubility, the solvent solubility, the physical properties of a film to be obtained, and the like. That is, in a case of adjusting the weight average molecular weight, it is possible to further enhance the applicability of the novolak resin of the first embodiment to the manufacture of electronic devices.

The polydispersity (the weight average molecular weight/the number average molecular weight) of the novolak resin of the first embodiment is preferably 1 to 20 and more preferably 1 to 10. In a case where the polydispersity is set within a proper numerical range, it becomes easy to obtain, for example, a uniform film, and the mechanical properties of a film to be obtained are improved. In addition, the improvement in patterning performance using an alkali developer can be expected.

The weight average molecular weight and the polydispersity can be determined by gel permeation chromatography (GPC) using polystyrene as a standard substance.

<Production Method for Novolak Resin (Synthesis Method)>

The novolak resin of the first embodiment can be typically produced (synthesized) by reacting a phenolic compound with fluoral in the presence of an acid catalyst.

The raw materials and reaction conditions will be described below.

(Phenolic Compound)

Examples of the phenolic compound include cresols such as phenol, o-cresol, m-cresol, and p-cresol; xylenols such as 2,3-xylenol, 2,4-xylenol, 2,5-xylenol, 2,6-xylenol, 3,4-xylenol, and 3,5-xylenol; ethylphenols such as o-ethylphenol, m-ethylphenol, and p-ethylphenol; isopropylphenols such as o-isopropylphenol, m-isopropylphenol, and p-isopropylphenol; butylphenols such as o-butylphenol, m-butylphenol, p-butylphenol, p-isobutylphenol, and p-tert-butylphenol; alkylphenols such as p-tert-amylphenol, p-octylphenol, p-nonylphenol, and p-cumylphenol; halogenated phenols such as fluorophenol, chlorophenol, bromophenol, and iodophenol; and monovalent phenol substituents such as p-phenylphenol, aminophenol, nitrophenol, dinitrophenol, and trinitrophenols.

In addition, examples thereof include polycyclic phenols such as 1-naphthol, 2-naphthol, and 2-hydroxyanthracene; and dihydroxybenzenes such as hydroquinone, resorcinol, and catechol.

Further, examples thereof include bisphenols such as bisphenol A, bisphenol F, bisphenol E, bisphenol S, bisphenol AF, hydrogenated bisphenol A, bisphenol M, bisphenol P, and bisphenol Z.

(Fluoral)

For the preparation of fluoral, a hydrate of a commercially available product (a product manufactured by Tokyo Chemical Industry Co., Ltd.) or a hemiacetal of fluoral can be used as equivalents of the fluoral. Further, a hydrate of fluoral or a hemiacetal body of fluoral can be prepared by the method described in Japanese Unexamined Patent Application, First Publication No. H05-97757.

Further, according to the method described in Japanese Unexamined Patent Application, First Publication No. H03-184933, it is possible to convert chloral into fluoral almost quantitatively by a catalytic vapor phase fluorination reaction of inexpensive chloral (trichloroethanal). By utilizing this, anhydrous fluoral can also be prepared. In Examples described later, fluoral is obtained in this way.

Fluoral is a low boiling point compound, which is generally highly self-reactive, and thus it is difficult to be handled. However, according to the findings of the inventors of the present invention, fluoral can be handled very stably in a hydrogen fluoride solution. In a case where fluoral is handled in hydrogen fluoride, 1,2,2,2-tetrafluoroethanol, which is an adduct consisting of fluoral and hydrogen fluoride, is generated as shown in the scheme below.

[Chemical 20]

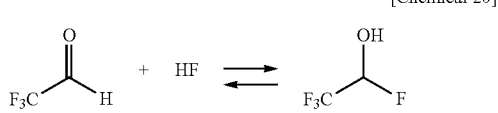

As shown above, 1,2,2,2-tetrafluoroethanol has an equilibrium relationship between fluoral and hydrogen fluoride. In a case where hydrogen fluoride is excessively present in the system, it is presumed that the equilibrium shifts to the 1,2,2,2-tetrafluoroethanol side, and as a result, the decomposition of fluoral is suppressed. According to the findings of the inventors of the present invention, it has been confirmed that fluoral in hydrogen fluoride not only improves the stability of the compound but also raises the boiling point, and thus fluoral, which is a low boiling point compound, can be easily handled as an adduct of hydrogen fluoride even near room temperature.

In a case where a prepared fluoral is handled as a mixture with hydrogen fluoride, the amount of hydrogen fluoride to be added is generally 0.1 to 100 mol, preferably 1 to 75 mol, and more preferably 2 to 50 mol, with respect to 1 mol of the prepared fluoral. The adding amount of hydrogen fluoride is determined in terms of sufficient stabilizing effect and cost.

In the mixture of fluoral and hydrogen fluoride, an excess quantity of hydrogen fluoride may be contained. However, since hydrogen fluoride itself has a function as an acidic substance, hydrogen fluoride may act as an acid catalyst or a dehydrating agent, or it may act as an additive that promotes a reaction. From these viewpoints, it can be said that there is an advantage in handling fluoral as a mixture of hydrogen fluoride.

(Synthesis Conditions for Novolak Resin)

The synthesis may be carried out by using an acid catalyst or the like while referring to the conventional method for synthesis of the novolak resin. The synthesis can be carried out, for example, under the conditions of a temperature of −20° C. to 150° C. and a time of 2 to 30 hours.

Regarding the pressure at the time of synthesis, the synthesis can be carried out under the condition of a pressure of 0.1 to 10 MPa in terms of absolute pressure. The pressure is preferably 0.1 to 5 MPa and more preferably 0.1 to 1 MPa. In a case of carrying out a reaction at a high pressure, a high-pressure reaction container is required and thus equipment cost is high. For this reason, it is preferable to carryout the reaction at a low pressure as possible.

In the synthesis, a solvent may be used. Examples of the solvent include ketones such as acetone and methyl ethyl ketone; alcohols such as ethanol and butanol; esters such as ethyl acetate and butyl acetate; ethers such as dimethyl ether, diethyl ether, tetrahydrofuran, diisopropyl ether, and tert-butyl methyl ether; ether alcohols such as ethoxyethyl alcohol; ether esters such as propylene glycol monomethyl ether acetate; amides such as N,N-dimethylformamide, N,N-dimethylacetamide, N-methylpyrrolidone, and N,N-dimethylimidazolidinone; nitriles such as acetonitrile, propionitrile, and benzonitrile; sulfoxides such as dimethyl sulfoxide; cyclic sulfones such as sulfolane; nitro-based hydrocarbons such as nitromethane and nitroethane; and nitro-based aromatic hydrocarbons such as nitrobenzene. Further, particularly in a case where fluoral is used as in the first embodiment, a halogen-based solvent such as 1,2-dichloroethane, chloroform, methylene chloride, carbon tetrachloride, or trichloroethane is also preferably used.

The mixing ratio of the phenolic compound:fluoral at the time of synthesis is preferably 2:1 to 1:1, more preferably 1.8:1, and still more preferably 1.5:1. In a case where the mixing ratio is within the above range, the fluorine atom can be efficiently introduced into the novolak resin, whereby the alkali solubility and the adhesiveness to a mold in a case the novolak resin is used in the use application to imprint can be made more suitable.

Examples of the catalyst that can be used in the synthesis include inorganic acids such as hydrochloric acid, sulfuric acid, perchloric acid, and phosphoric acid; organic acids such as formic acid, acetic acid, oxalic acid, trichloroacetic acid, and p-toluenesulfonic acid; and divalent metal salts such zinc acetate, zinc chloride, and magnesium acetate. These may be used alone or in a combination of two or more thereof. By the way, in a case where a mixture of fluoral and hydrogen fluoride is used as described above, hydrogen fluoride is conceived to act as an acid catalyst.

In a case where an acid catalyst is used in the synthesis, the amount of the acid catalyst is preferably 0.01 to 100 mol, more preferably 0.1 to 30 mol, and still more preferably 0.5 to 25 mol, with respect to 1 mol of fluoral. In a case where the amount of the acid catalyst is set within the above range, the fluorine atom can be efficiently introduced into the novolak resin, whereby the alkali solubility and the adhesiveness to a mold in a case the novolak resin is used in the use application to imprint can be made more suitable.
(Other Supplements)

For the obtained novolak resin, it is preferable that unreacted reactants and impurities are removed by combining a precipitation treatment by putting it in a poor solvent (typically water), a cleaning treatment with water or sodium bicarbonate water, a liquid separation operation, and the like. As specific methods of these treatments, known methods in polymer synthesis can be appropriately referenced.

Further, for example, the obtained novolak resin is reacted with epichlorohydrin, thereby capable of being used as an epoxy resin. Further, the obtained epoxy resin is reacted with a carboxylic acid such as (meth)acrylic acid, thereby capable of being used as an epoxy (meth)acrylate resin. Further, the obtained epoxy (meth)acrylate resin is reacted with an acid anhydride or the like, thereby capable of being used as an acid-modified epoxy (meth)acrylate resin. Here, the acid anhydride to be reacted may be a compound having a polymerizable carbon-carbon bond.

The novolak resin of the present embodiment may have a powder shape. Further, the above powder can be dissolved in any solvent and used as the novolak resin solution.

Second Embodiment

<Epoxy Resin>

The epoxy resin of the second embodiment has a partial structure represented by —C(CF$_3$)H—.

The epoxy resin of the second embodiment has, for example, good light transmittance. In particular, it has good transmittance of visible light and near-ultraviolet rays. This is conceived to be because the absorption wavelength is shifted as compared with the general fluorine-free epoxy resin since the fluorine atom having a large electronegativity is included in the structure of the epoxy resin.

Good transmittance of visible light means that the epoxy resin of the second embodiment is preferably applied, for example, as a raw material of an optical member that requires a high degree of transparency.

Good transmittance of near-ultraviolet rays means that the epoxy resin of the second embodiment can be preferably applied, for example, to a photosensitive resin composition that is used for the manufacture of an electronic device. This is because, in the manufacture of an electronic device, the photosensitive resin composition is often cured or patterned by irradiating the photosensitive resin composition with near-ultraviolet rays.

In addition, it can be said that the epoxy resin of the second embodiment suppresses excessive rigidity of the resin although it contains a fluorine atom.

In general, in a case where fluorine is introduced into a resin, the resin tends to be rigid. The rigidity of the resin is preferable, for example, in terms of improving heat resistance. However, excessive rigidity might cause deterioration of other properties such as deterioration of mechanical properties (tendency to be brittle) of the resin and the cured film.

However, it is presumed that the excessive rigidity of the resin can be suppressed while obtaining the effect of introducing the fluorine atom (good transparency and the like) due to the fact that the epoxy resin of the second embodiment probably has a structure (—C(CF$_3$)H—) having only one CF$_3$ group instead of the structure having two CF$_3$ groups (—C(CF$_3$)$_2$—) described in Patent Document 1.

It is noted that regarding the degree of rigidity of the resin, it is possible to use, for example, the glass transition temperature of the cured substance of the resin as an index.

In addition, the epoxy resin of the second embodiment tends to have good solubility in various solvents (organic solvents). Although the reason for this is not always clear, it is presumed that a good affinity with various organic solvents is obtained since the fluorine atom is contained in the resin. Additionally or alternatively, it is presumed that the resin is easily moved by the suppression of the excessive rigidity of the resin as described above, and as a result, the solvent solubility is good.

In addition, the epoxy resin of the second embodiment preferably has a structural unit represented by General Formula (A). In a case where it has the above structural unit, the light transmittance, the suppression of excessive rigidity of the resin, and the solubility described above can be made more suitable.

[Chemical 21]

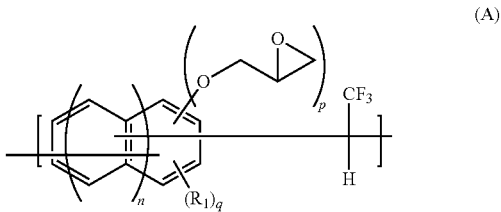

In General Formula (A),

R$_1$ represents a monovalent substituent, and in a case where a plurality of R$_1$'s are present, the plurality of R$_1$'s are may be the same or different from each other, n is 0 to 2, and p is 1 or more, and q is 0 or more, provided that in a case where n is 0, p+q≤4 is satisfied, in a case where n is 1, p+q≤6 is satisfied, and in a case where n is 2, p+q≤8 is satisfied.

The description of the epoxy resin related to the second embodiment will be continued.
(Description of General Formula (A))

Examples of the monovalent substituent as R$_1$ include an alkyl group, an alkoxy group, a cycloalkyl group, an aryl group, an alkenyl group, an alkynyl group, an aryloxy group, an amino group, an alkylamino group, an arylamino group, a cyano group, a nitro group, a silyl group, and a halogeno group (for example, a fluoro group or the like). These groups may further have a substituent such as a fluorine atom or a carboxyl group.

R$_1$ is preferably an alkyl group, an alkoxy group, a fluorinated alkyl group (for example, a trifluoromethyl group), a halogeno group (for example, a fluoro group), or a nitro group. Among the above, R$_1$ is preferably an alkyl group. The specific example of the alkyl group is preferably a linear or branched alkyl group having 1 to 6 carbon atoms. Among the above, it is preferably an n-butyl group, an s-butyl group, an isobutyl group, a t-butyl group, an n-propyl group, an i-propyl group, an ethyl group, or a methyl group, and particularly preferably an ethyl group or a methyl group.

It suffices that n is 0 to 2; however, n is preferably 0. n is preferably 0 or 1, from the viewpoints of the transmittance of visible light of an optical member and the transmittance of light (a g-line, an i-line, an h-line, and the like) that is often used in the manufacture of electronic devices. In a case of considering an electronic device in a broad sense, $n=1$ may be good from the viewpoint of heat resistance, for example, in a case of an underlayer film.

p is 1 or more, and q is 0 or more. However, in a case where n is 0, $p+q\leq 4$ is satisfied, in a case where n is 1, $p+q\leq 6$ is satisfied, and in a case where n is 2, $p+q\leq 8$ is satisfied.

As described above, n is preferably 0.

From the viewpoints of ease of preparation of raw materials and cost, p is preferably 1.

From the viewpoint of ease of preparation of raw materials and cost, q is preferably 0 to 2, more preferably 0 or 1, and still more preferably 0.

The preferred aspect of the structural unit represented by General Formula (A) includes structural units represented by General Formulae (B) to (D) and other listed structural units. Among the listed structural units, the definitions of p and q are the same as those of General Formula (A).

It is surely noted that although the epoxy resin of the second embodiment applies to General Formula (A), it may have two or more structural units which are different structures from each other. For example, the epoxy resin of the second embodiment may have two or more structural units among the structural units of Formulae (B) to (D) listed below and other listed structural units. Of course, the epoxy resin of the second embodiment may be composed of only one structural unit.

Further, the epoxy resin of the second embodiment may include a structural unit that applies to General Formula (A) and a structural unit that does not apply to General Formula (A).

[Chemical 22]

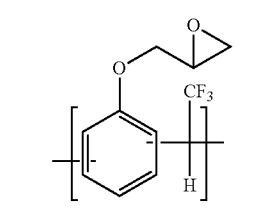

(B)

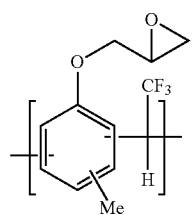

(C)

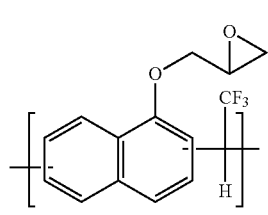

(D)

[Chemical 23]

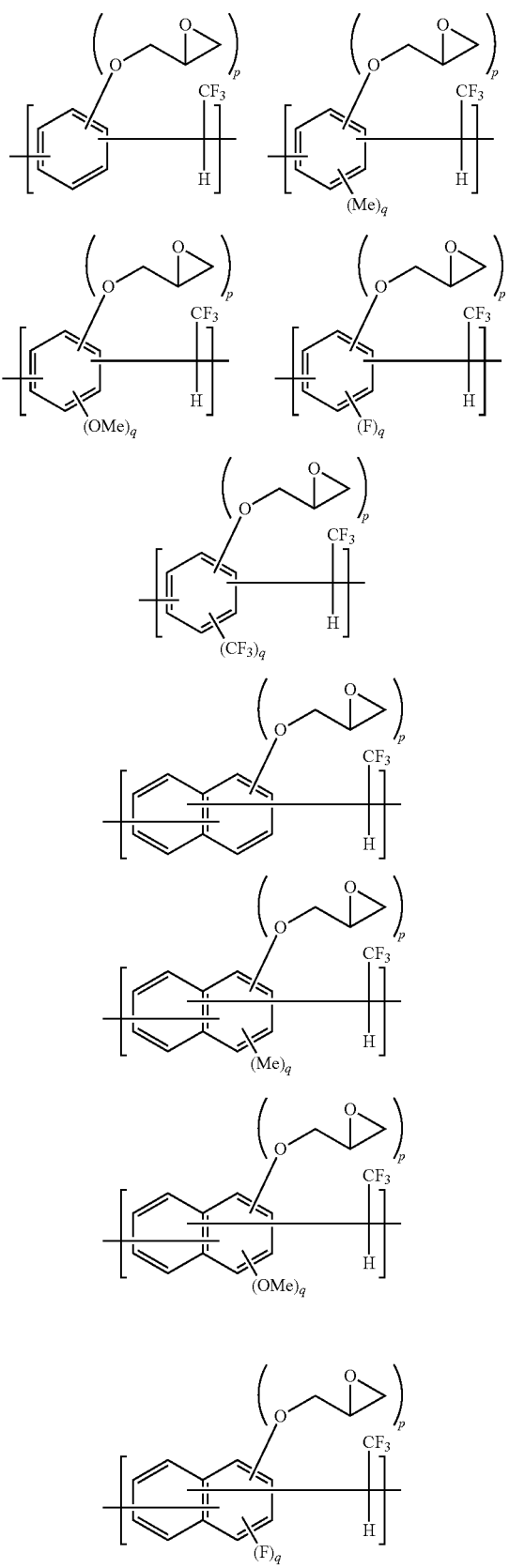

-continued
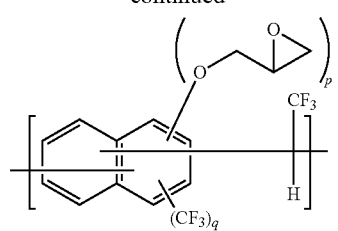
[Chemical 24]
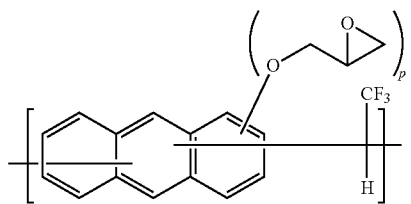
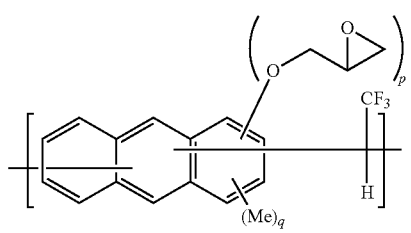
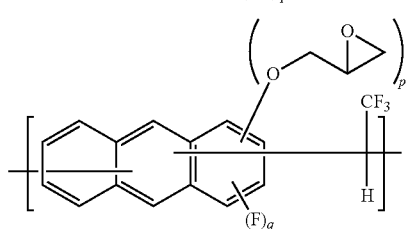
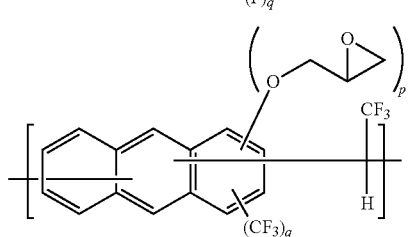
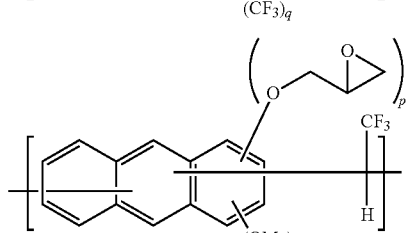
[Chemical 25]
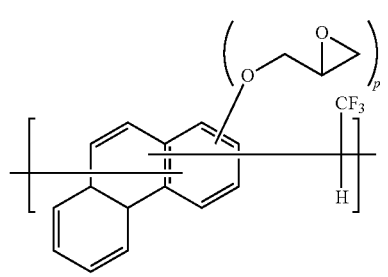
-continued
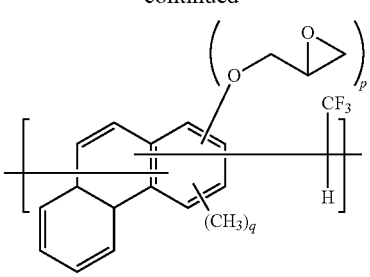
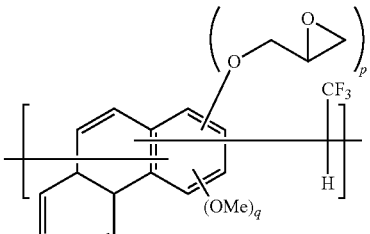
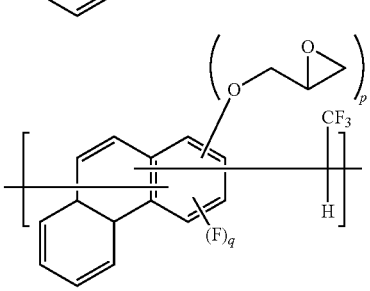
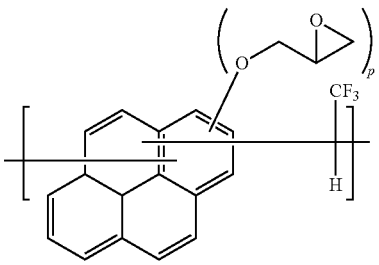
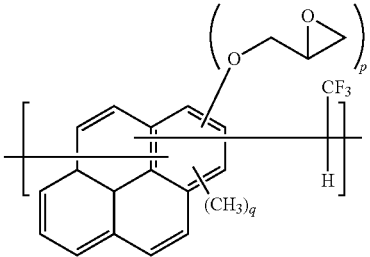
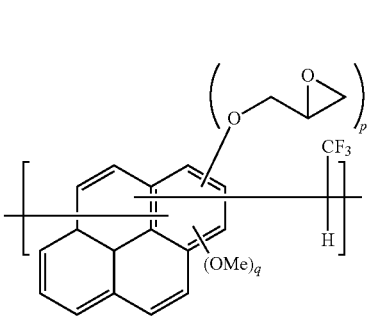

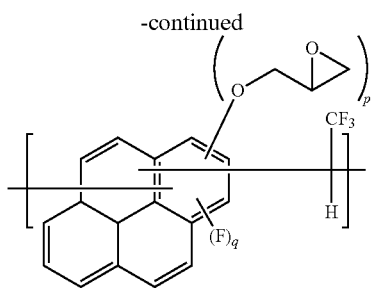

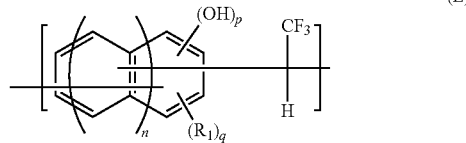

In General Formula (E),
R$_1$ represents a monovalent substituent, and in a case where a plurality of R$_1$'s are present, the plurality of R$_1$'s are may be the same or different from each other,
n is 0 to 2, and
p is 1 or more, and q is 0 or more, provided that in a case where n is 0, p+q≤4 is satisfied, in a case where n is 1, p+q≤6 is satisfied, and in a case where n is 2, p+q≤8 is satisfied.

Hereinafter, first, (i) the raw material and the production method for a novolak resin having a structural unit represented by General Formula (E) will be described. Next, (ii) the epoxidation step of the novolak resin will be described.
(i) Raw Material and Production Method for a Novolak Resin Having a Structural Unit Represented General Formula (E).

The novolak resin having a structural unit represented by General Formula (E) can be prepared according to the same method as the method described in <Production method for novolak resin (synthesis method)> in <<First embodiment>>, and it can be typically produced (synthesized) by reacting a phenolic compound with fluoral in the presence of an acid catalyst.

For the obtained novolak resin, it is preferable that unreacted reactants and impurities are removed by combining a precipitation treatment by putting it in a poor solvent (typically water), a cleaning treatment with water or sodium bicarbonate water, a liquid separation operation, and the like. As specific methods of these treatments, known methods in polymer synthesis can be appropriately referenced.
(ii) Epoxidation Step of Novolak Resin In the epoxidation step the novolak resin, the novolak resin having a structural unit represented by General Formula (E) is reacted with epihalohydrin in the presence of a base. As a result of the reaction, the hydrogen atom of the phenolic hydroxy group in General Formula (E) is converted into a glycidyl group to obtain an epoxy resin having a structural unit represented by General Formula (A).

The amount of epihalohydrin (typically epichlorohydrin or epibromohydrin) that is used in the reaction is preferably 0.1 mol to 100 mol and more preferably 1.0 to 50 mol with respect to 1 mol of the hydroxy group of the novolak resin having a structural unit represented by General Formula (E).

Examples of the base to be used in the reaction generally include an alkali metal hydroxide, an alkali metal alkoxide, and an alkali metal carbonate. Specific examples thereof include sodium hydroxide, potassium hydroxide, lithium hydroxide, sodium methoxide, potassium methoxide, lithium methoxide, sodium ethoxide, potassium ethoxide, lithium ethoxide, sodium butoxide, potassium butoxide, lithium butoxide, sodium carbonate, potassium carbonate, and lithium carbonate. One of these bases may be used alone, or two or more thereof may be used in combination.

In the preferred aspect of the reaction, an alkali metal hydroxide such as sodium hydroxide or potassium hydrox- (Molecular Weight and Dispersivity)

The weight average molecular weight of the epoxy resin of the second embodiment is preferably 300 to 200,000, more preferably 300 to 150,000, and still more preferably 300 to 100,000. By adjusting the weight average molecular weight, it is possible to adjust the solvent solubility and the physical properties of a film to be obtained. That is, by adjusting the weight average molecular weight, it is possible to further enhance the applicability of the epoxy resin of the second embodiment to the manufacture of optical materials or electronic devices.

The polydispersity (the weight average molecular weight/the number average molecular weight) of the epoxy resin of the second embodiment is preferably 1 to 20 and more preferably 1 to 10. In a case where the polydispersity is set within a proper numerical range, it tends to be easy to obtain, for example, a uniform film, and the mechanical properties of a film to be obtained tend to be improved.

The weight average molecular weight and the polydispersity can be determined by gel permeation chromatography (GPC) using polystyrene as a standard substance.
(Total Chlorine Amount)

The total chlorine amount of the epoxy resin of the second embodiment is preferably 0 to 4,000 ppm and more preferably 0 to 2,000 ppm. In a case where the total chlorine amount is not too large, it is possible to reduce, for example, the problem of corrosion in a case of applying the epoxy resin to various use applications.

The "total chlorine amount" can be measured based on JIS K 7243-3: 2005.
(Epoxy Equivalent)

The epoxy equivalent of the epoxy resin of the second embodiment is preferably 150 to 100,000 g/eq, more preferably 150 to 10,000 g/eq, and still more preferably 150 to 2,000 g/eq. In a case where the epoxy equivalent is set within the preferred numerical range, the proper curability can be exhibited.
<Production Method for Epoxy Resin (Synthesis Method)>

The epoxy resin of the second embodiment can be produced, typically, by undergoing a step (an epoxidation step) of reacting a novolak resin having a partial structure represented by —C(CF$_3$)H— with epihalohydrin in the presence of a base.

Examples of the novolak resin having a partial structure represented by —C(CF$_3$)H— include a novolak resin having a structural unit represented by General Formula (E).

ide as abase is generally added to a reaction system in a state of a solid or an aqueous solution to make the reaction system "alkaline condition".

The adding amount of the base is preferably 0.1 mol to 50 mol and more preferably 1 to 10 mol with respect to 1 mol of the hydroxy group of the novolak resin having a structural unit represented by General Formula (E).

The reaction can be carried out under normal pressure (0.1 MPa; in terms of absolute pressure) or under reduced pressure. The reaction temperature is generally 20° C. to 150° C. in a case of a reaction under normal pressure, and it is 30° C. to 80° C. in a case of a reaction under reduced pressure.

In the reaction, dehydration is carried out by a method in which as necessary, a reaction solution is co-boiled while maintaining a predetermined temperature, the volatilized vapor is cooled, the obtained condensate is separated into oil and water, and the oily fraction from which water has been removed is returned to the reaction system.

Regarding the addition of the alkali metal hydroxide, in order to suppress an abrupt reaction, the alkali metal hydroxide is generally added to the reaction system intermittently or continuously in small amounts over 0.1 to 10 hours.

The total reaction time is generally 1 to 15 hours. In the reaction, it is preferable that the end point of the reaction is set to the timing when it is confirmed that the reaction conversion rate has reached a predetermined value, by using an analytical instrument such as a nuclear magnetic resonance apparatus (NMR) or liquid chromatography (LC).

After completion of the reaction, it is preferable to remove the insoluble by-product salt by filtration or washing with water. Then, unreacted epihalohydrin is preferably removed by distillation under reduced pressure. In this way, a desired epoxy resin can be obtained.

In the reaction, the following catalyst may be used: quaternary ammonium salts such as tetramethylammonium chloride and tetraethylammonium bromide; tertiary amines such as benzyl dimethylamine and 2,4,6-tris(dimethylaminomethyl)phenol; imidazoles such as 2-ethyl-4-methylimidazole and 2-phenylimidazole; phosphonium salts such as ethyltriphenylphosphonium iodide; and phosphines such as triphenylphosphine.

In the reaction, the following inactive organic solvent may be used: alcohols such as ethanol and isopropyl alcohol; ketones such as acetone and methyl ethyl ketone; ethers such as dioxane and ethylene glycol dimethyl ether; glycol ethers such as methoxypropanol; and aprotonic polar solvents such as dimethyl sulfoxide and dimethylformamide. Only one kind of these organic solvents may be used, or two or more kinds thereof may be mixed and used.

In a case where the amount of saponified halogen in the obtained epoxy resin is too large, it suffices that the obtained epoxy resin is retreated to obtain a purified epoxy resin in which the amount of saponified halogen is sufficiently reduced. As the specific procedure, (i) the crude epoxy resin is redissolved in an inactive organic solvent such as isopropyl alcohol, methyl ethyl ketone, methyl isobutyl ketone, toluene, xylene, dioxane, methoxypropanol, or dimethyl sulfoxide to make it a solution, (ii) an alkali metal hydroxide is added to the solution as a solid or an aqueous solution, (iii) then, a recirculation reaction is carried out at a temperature of about 20° C. to 120° C. for 0.5 to 8 hours, and (iv) then, the excess alkali metal hydroxide and the by-product salt are removed by a method such as washing with water, and further, the organic solvent is removed by distillation under reduced pressure. This makes it possible to obtain a purified epoxy resin having a structural unit represented by General Formula (A).

<<Resin Composition>>

The novolak resin of the first embodiment and the epoxy resin of the second embodiment can be used as a resin composition containing the novolak resin of the first embodiment and/or the epoxy resin of the second embodiment, by mixing them with each component different from the novolak resin of the first embodiment and the epoxy resin of the second embodiment.

<Photosensitive Resin Composition>

A photosensitive resin composition can be preferably mentioned as an application destination of the novolak resin of the first embodiment and the epoxy resin of the second embodiment. Specifically, a photosensitive resin composition can be prepared by mixing the novolak resin of the first embodiment and/or the epoxy resin of the second embodiment with at least a photosensitizing agent.

As already described, the novolak resin of the first embodiment and the epoxy resin of the second embodiment tend to have a good light transmittance of specific light and/or good alkali solubility. In a case where the novolak resin of the first embodiment and the epoxy resin of the second embodiment, having such good properties, are used, a photosensitive resin composition having good performance can be prepared. In particular, the photosensitive resin composition in the present specification is capable of being patterned by exposure using a photoresist composition, that is, a photomask, and subsequent development, and it is useful as a composition that is capable of selectively protecting the substrate surface from treatments such as etching in the manufacture of electronic devices. This is due to the transmittance of specific light and alkali solubility of the novolak resin of the first embodiment and the epoxy resin of the second embodiment, as well as the etching resistance of the aromatic ring contained in the novolak resin of the first embodiment and the epoxy resin of the second embodiment.

Further, the above-described photosensitive resin composition is also useful as a solder resist composition or an imprint composition, that is, as a composition that enables patterning with light and can selectively protect the substrate surface from treatments such as etching in the manufacture of electronic devices. This is due to the above-described transmittance of specific light as well as the etching resistance of the aromatic ring contained in the novolak resin of the first embodiment and the epoxy resin of the second embodiment.

The amount of the novolak resin of the first embodiment and/or the epoxy resin of the second embodiment is, for example, 20% to 99% by mass and preferably 50% to 98% by mass in the total non-volatile components of the photosensitive resin composition.

In a case where the novolak resin of the first embodiment is used in the photosensitive resin composition, a quinone diazide compound is typically used as the photosensitizing agent. The quinone diazide compound is particularly preferably used in preparing a positive-type photosensitive resin composition. There is no particular limitation on the quinone diazide compound that is capable of being used. Examples of the quinone diazide compound include a compound in which sulfonate of quinone diazide is bonded to a polyhydroxy compound by an ester bond, a compound in which sulfonate of quinone diazide is bonded to a polyamino compound by a sulfonamide bond, and a compound in which sulfonate of quinone diazide is bonded to a polyhydroxy-polyamino compound by an ester bond and/or a sulfonamide bond. It is preferable that 50% by mole or more of all functional groups of this polyhydroxy compound or polyamino compound is substituted with quinone diazide.

As the structural unit of the quinone diazide, any one of a 5-naphthoquinonediazidosulfonyl group or a 4-naphthoquinonediazidosulfonyl group is preferably used. The 4-naphthoquinonediazidosulfonyl ester compound has an absorption in the i-line range and thus is suitable for the i-line exposure.

The 5-naphthoquinonediazidosulfonyl ester compound has an absorption extending to the g-line range and thus is suitable for the g-line exposure. It is preferable to select a 4-naphthoquinonediazidosulfonyl ester compound or a 5-naphthoquinonediazidosulfonyl ester compound depending on the wavelength for exposure. In addition, in the same molecule, a naphthoquinonediazidosulfonyl ester compound having a 4-naphthoquinonediazidosulfonyl group or a 5-naphthoquinonediazidosulfonyl group may be contained, or both a 4-naphthoquinonediazidosulfonyl ester compound and a 5-naphthoquinonediazidosulfonyl ester compound may be contained.

The quinone diazide compound can be purchased from, for example, Tokyo Chemical Industry Co., Ltd.

In addition, a photopolymerization initiator may be used as the photosensitizing agent. The polymerization initiator is preferably used to prepare a negative-type photosensitive resin composition, particularly in a case where the above-described novolak resin contains a polymerizable carbon-carbon double bond.

The photopolymerization initiator is not particularly limited as long as it can generate active species such as radicals upon irradiation with high-energy light such as ultraviolet rays and polymerize a polymerizable carbon-carbon double bond. Specific examples thereof include a photoradical polymerization initiator.

In the photoradical polymerization initiator, there is an intramolecular cleavage type in which an intramolecular bond is cleaved to generate a radical and a hydrogen abstraction type in which a hydrogen donor such as a tertiary amine or an ether is used in combination to generate a radical. Any of them can be used in the first embodiment. For example, 2-hydroxy-2-methyl-1-phenylpropane-1-one, which is the intramolecular cleavage type, generates a radical by cleaving a carbon-carbon bond upon irradiation with light. In addition, examples of the hydrogen abstraction type include benzophenone, methyl orthobenzoin benzoate, and 4-benzoyl-4'-methyldiphenylsulfide.

The photoradical polymerization generator is not particularly limited as long as it is a compound that generates a radical by absorbing light, and a commercially available photoradical polymerization initiator can be used. The photoradical polymerization initiator can be purchased from, for example, BASF SE.

The amount of the photosensitizing agent is typically 1% to 90% by mass and preferably 1% to 50% by mass in the total non-volatile components of the photosensitive resin composition.

In particular, in a case where the photosensitizing agent is a photopolymerization initiator, the proportion thereof is preferably within a range of 0.1% to 7% by mass based on the total mass of the non-volatile components of the photosensitive resin composition.

The photosensitive resin composition preferably contains a solvent. In other words, the photosensitive resin composition is preferably a photosensitive resin composition in which components such as the novolak resin of the first embodiment and/or the epoxy resin of the second embodiment and a photosensitizing agent are dissolved or dispersed in a solvent.

Examples of the solvent include aprotonic polar solvents such as N-methyl-2-pyrrolidone, γ-butyrolactone, N,N-dimethylformamide, N,N-dimethylacetamide, and dimethylsulfoxide; ethers such as tetrahydrofuran, dioxane, and propylene glycol monomethyl ether; ketones such acetone, methyl ethyl ketone, diisobutyl ketone, and diacetone alcohol; esters such as ethyl acetate, propylene glycol monomethyl ether acetate, and ethyl lactate; and aromatic hydrocarbons such as toluene and xylene. The solvent may be a single solvent or a mixed solvent.

The using amount of the solvent may be appropriately adjusted depending on the thickness or the like of the film to be formed by using the photosensitive resin composition. Typically, the using amount of the solvent is such that the concentration of the non-volatile components of the photosensitive resin composition is 1% to 95% by mass.

In addition to the novolak resin of the first embodiment and/or the epoxy resin of the second embodiment, the photosensitizing agent, and the solvent, the photosensitive resin composition may contain an optional component for adjusting the performance. Examples of the optional component include a surfactant, an antioxidant, a sensitizing agent, a resin different from the novolak resin of the first embodiment and the epoxy resin of the second embodiment, a filler material (a filler), a coloring agent, a curable monomer, and an oligomer.

In a case of using the photosensitive resin composition, for example, as in the following procedure, it is possible to form a good pattern.

(1) A film forming step of applying a photosensitive resin composition onto a base material to form a photosensitive resin film
(2) An exposure step of exposing the photosensitive resin film
(3) A developing step of developing the exposed photosensitive film to form a pattern Hereinafter, a description will be added in each of the above-described steps.

Film Forming Step

The base material onto which the photosensitive resin composition is applied is not particularly limited. Examples thereof include a silicon wafer, metal, glass, ceramic, and a base material made of plastic. Further, the photosensitive resin composition may be applied onto a base material onto which another polymer has been applied in advance.

As the coating method, a conventionally known coating method such as spin coating, dip coating, spray coating, bar coating, or a method using an applicator, ink jet, or roll coater can be applied without particular limitation.

The base material coated with the photosensitive resin composition is heated at, for example, 80° C. to 120° C. for about 30 seconds to 30 minutes to dry the solvent. This makes it possible to obtain a photosensitive film.

Exposure Step

The photosensitive film obtained in the film forming step is irradiated with light, generally, through a photomask for forming a target pattern.

A known method or device can be used for the exposure treatment. As the light source, a light source having a wavelength in a range of 100 to 600 nm can be used. Specifically, a low-pressure mercury lamp, a high-pressure mercury lamp, an ultra-high-pressure mercury lamp, a KrF excimer laser (wavelength: 248 nm), or the like can be used.

The exposure amount is generally about 1 to 10,000 mJ/cm² and preferably about 10 to 5,000 mJ/cm².

After the exposure, post-exposure heating can be carried out before and after the developing step as necessary. The temperature of post-exposure heating is 60° C. to 180° C., and the time of post-exposure heating is generally 0.1 to 60 minutes and preferably 0.5 to 10 minutes.

Developing Step

The photosensitive film after exposure obtained in the exposure step is developed to produce a film having a pattern shape. In a case where an alkaline aqueous solution is used as the developer, the exposed portions are dissolved, and a pattern is formed.

The developer is not particularly limited as long as it can remove the photosensitive film in the exposed portions. Specific examples thereof include an inorganic alkali, a primary amine, a secondary amine, a tertiary amine, an alcohol amine, a quaternary ammonium salt, and an alkaline aqueous solution in which a mixture of this compound is dissolved.

More specific examples thereof include an alkaline aqueous solution of a compound such as potassium carbonate, sodium carbonate, potassium hydroxide, sodium hydroxide, ammonia, ethylamine, diethylamine, triethylamine, triethanolamine, and tetramethylammonium hydroxide (abbreviation: TMAH). Among them, it is preferable to use a TMAH aqueous solution, and in particular, it is preferable to use a TMAH aqueous solution of 0.1% to 5% by mass.

As the developing method, a known method such as an immersion method, a puddle method, or a spraying method can be used. The development time is generally 0.1 to 120 minutes and preferably 0.5 to 60 minutes. Then, washing, rinsing, drying, and the like are carried out as necessary. In this way, a pattern can be formed on the substrate.

Curable Resin Composition in First Embodiment

As the application destination of the novolak resin of the first embodiment, which is different from the photosensitive resin composition, a curable resin composition can be mentioned.

For example, a curable resin composition can be produced by using the novolak resin of the first embodiment in combination with an epoxy resin (in this case, the novolak resin of the first embodiment acts as a curing agent for the epoxy resin).

The novolak resin of the first embodiment contains a fluorine atom. As a result, a cured substance formed from the curable resin composition containing the novolak resin of the first embodiment is expected to have a dielectric constant and/or a dielectric loss tangent, suitable for the manufacture of electronic devices.

In particular, the curable resin composition containing the novolak resin of the first embodiment is also useful as a solder resist composition or an imprint composition, that is, as a composition that is capable of being subjected to pattern printing by a known method such as a screen printing method and to curing by heat or the like and is capable of selectively protecting the substrate surface from treatments such as etching in the manufacture of electronic devices. This is due to the etching resistance of the aromatic ring contained in the novolak resin.

(Epoxy Resin)

The epoxy resin to be combined with the novolak resin of the first embodiment is not particularly limited. The epoxy resin of the second embodiment described later may be used, or other known epoxy resin may be used. Examples of the known epoxy resin include difunctional epoxy resins, for example, a bisphenol A type epoxy resin, a bisphenol F type epoxy resin, a bisphenol AF type epoxy resin, a bisphenol AD type epoxy resin, a hydrogenated bisphenol A type epoxy resin, a hydrogenated bisphenol F-type epoxy resin, a diglycidyl ether of a bisphenol A-alkylene oxide adduct, a diglycidyl ether of an alkylene oxide adduct of bisphenol F, a bisphenol S type epoxy resin, a tetramethyl bisphenol A type epoxy resin, a tetramethyl bisphenol F type epoxy resin, a thiodiphenol type epoxy resin, a dihydroxydiphenyl ether type epoxy resin, a terpene diphenol type epoxy resin, a biphenol type epoxy resin, a tetramethyl biphenol type epoxy resin, a hydroquinone type epoxy resin, a methylhydroquinone type epoxy resin, a dibutylhydroquinone type epoxy resin, a resorcin type epoxy resin, a methylresorcin type epoxy resin, and a dihydroxynaphthalene type epoxy resin.

Further, examples of the polyfunctional epoxy resin include a phenol novolak type epoxy resin, a cresol novolak type epoxy resin, a bisphenol A novolak type epoxy resin, a bisphenol AF novolak type epoxy resin, a dicyclopentadienephenol type epoxy resin, a terpenephenol type epoxy resin, a phenol aralkyl type epoxy resin, a biphenyl aralkyl type epoxy resin, a naphthol novolak type epoxy resin, polyhydric phenol resins obtained by a condensation reaction with various aldehydes such as hydroxybenzaldehyde, croton aldehyde, and glyoxal, epoxy resins produced from various phenolic compounds such as modified phenolic resins obtained by polycondensing petroleum-based heavy oil or pitches, formaldehyde polymers, and phenols in the presence of an acid catalyst, and epihalohydrin, and triglycidyl isocyanurate.

Further, examples of the combined epoxy resin include epoxy resins produced from various amine compounds such as diaminodiphenylmethane, aminophenol, and xylenediamine, and epihalohydrin, epoxy resins produced from various carboxylic acids such as methylhexahydroxyphthalic acid and dimer acid, and epihalohydrin, a diluent for epoxy resins such as a glycidyl ether of an aliphatic alcohol, and an alicyclic epoxy resin represented by 3,4-epoxycyclohexylmethyl-3',4'-epoxycyclohexanecarboxylate.

In a case where the curable resin composition in the second embodiment contains a combined epoxy resin, it may contain only one combined epoxy resin or may contain two or more combined epoxy resins having chemical structures different from each other.

The amount ratio between the novolak resin of the first embodiment and the epoxy resin may be appropriately designed in consideration of the epoxy equivalent and the like of the epoxy resin. Typically, the mass ratio is "the novolak resin of the first embodiment:epoxy resin=1:10 to 10:1".

(Curing Agent)

The curable resin composition in the first embodiment may contain a curing agent other than the novolak resin of the first embodiment. In a case where the curable resin composition in the first embodiment contains a curing agent, the kind of the curing agent is not particularly limited. Examples of the curing agent include an amine-based curing agent, an acid anhydride-based curing agent, and a phenolic curing agent.

More specific examples of the amine-based curing agent include aliphatic and alicyclic amines such as diethylenetriamine, triethylenetetramine, tetraethylenepentamine, N-aminoethylpiperazine, isophoronediamine, bis(4-aminocyclohexyl)methane, bis(aminomethyl)cyclohexane, m-xylylenediamine, and 3,9-bis(3-aminopropyl)-2,4,8,10-tetraspiro[5,5]undecane; aromatic amines such as metaphenylenediamine, diaminodiphenylmethane, and diaminodiphenylsulfone; and tertiary amines such as benzyldimethylamine, 2,4,6-tris(dimethylaminomethyl)phenol and 1,8-diazabicyclo-(5,4,0)-undecene-7,1,5-diazabicyclo-(4,3,0)-nonene-7, and salts thereof.

More specific examples of the acid anhydride-based curing agent include aromatic acid anhydrides such as phthalic anhydride, trimellitic anhydride, and pyromellitic anhydride; and alicyclic acid anhydrides such as tetrahydrophthalic anhydride, methyltetrahydrophthalic anhydride, hexahydrophthalic anhydride, methylhexahydrophthalic anhydride, methylendomethylenetetrahydrophthalic anhydride, and trialkyltetrahydrophthalic anhydride.

More specific examples of the phenolic curing agent include dihydric phenols such as catechol, resorcin, hydroquinone, bisphenol F, bisphenol A, bisphenol AF, bisphenol S, and biphenol, phenol novolaks, cresol novolaks, bisphenol A novolaks, bisphenol AF novolaks, trishydroxyphenylmethanes, and aralkylpolyphenols.

Examples of the phenolic curing agent also include polyhydric phenols such as dicyclopentadiene polyphenols.

Examples of other curing agents include imidazole-based compounds and salts thereof; Bronsted acid salts such as $BF_3$ complex compounds of amines, aliphatic sulfonium salts, aromatic sulfonium salts, iodonium salts, and phosphonium salts; organic acid hydrazides such as dicyandiamide, adipic acid dihydrazide, and phthalic acid dihydrazide; and polycarboxylic acids such as adipic acid, sebacic acid, terephthalic acid, trimellitic acid, and carboxyl group-containing polyester.

In a case where the curable resin composition in the first embodiment contains a curing agent, it may contain only one curing agent or may contain two or more curing agents having chemical structures different from each other.

In a case where the curable resin composition in the first embodiment contains a curing agent, the amount thereof may be appropriately adjusted in consideration of the epoxy equivalent or the like of the epoxy resin. Typically, in a case where a curing agent is used, the amount thereof is about 0.1 to 1,000 parts by mass with respect to 100 parts by mass of the epoxy resin.

(Curing Accelerator)

From the viewpoint of increasing the curing rate and/or making the curing more complete, the curable resin composition in the first embodiment may contain a curing accelerator. As the curing accelerator, it is possible to use a curing accelerator for general epoxy resins such as tertiary amines, imidazoles, organic phosphine compounds or salts thereof, and metal soaps such as zinc octylate and tin octylate.

In a case where the curable resin composition in the first embodiment contains a curing accelerator, it may contain only one curing accelerator or may contain two or more curing accelerators having chemical structures different from each other.

In a case where the curable resin composition in the first embodiment contains a curing accelerator, the amount thereof may be appropriately adjusted. Typically, in a case where a curing accelerator is used, the amount thereof is about 0.001 to 10 parts by mass with respect to 100 parts by mass of the epoxy resin.

(Other Components)

The curable resin composition according to the first embodiment may contain one or more optional components in addition to the above components. Examples of the optional component include an antioxidant, a filler material (a filler), a coloring agent, a resin other than novolak resin, a curable monomer, an oligomer, and an organic solvent.

Examples of the antioxidant include phenolic, sulfur-based, and phosphorus-based antioxidants. In a case where an antioxidant is used, the amount thereof is generally 0.005 to 5 parts by mass and preferably 0.01 to 1 part by mass with respect to 100 parts by mass of the novolak resin.

Examples of the filler material (the filler) include a metal oxide such as aluminum oxide or magnesium oxide, a silicon compound such as fine powder silica, molten silica, or crystalline silica, glass beads, a metal hydroxide such as aluminum hydroxide, metals such as gold, silver, copper, aluminum, fluororesin powder such as polytetrafluoroethylene particles, carbon, rubbers, kaolin, mica, quartz powder, graphite, molybdenum disulfide, and boron nitride.

In a case where a filler material (a filler) is used, the amount thereof is, for example, 1,500 parts by mass or less and preferably 0.1 to 1,500 parts by mass with respect to 100 parts by mass of the novolak resin.

Examples of the coloring agent include an inorganic pigment such as titanium dioxide, molybdenum red, dark blue, ultramarine blue, cadmium yellow, or cadmium red, an organic pigment, carbon black, and a fluorophore.

In a case where a coloring agent is used, the amount thereof is generally 0.01 to 30 parts by mass with respect to 100 parts by mass of the novolak resin.

Examples of the flame retardant include antimony trioxide, a bromine compound, and a phosphorus compound. In a case where a flame retardant is used, the amount thereof is generally 0.01 to 30 parts by mass with respect to 100 parts by mass of the novolak resin.

The properties of the curable resin composition in the first embodiment are not particularly limited. The curable resin composition in the first embodiment may have a solid shape (a powder shape, a granule shape, a tablet shape, or the like) or a shape of a liquid containing a solvent. Specific examples of the solvent include those exemplified in the section of the photosensitive resin composition.

Curable Resin Composition in Second Embodiment

The curable resin composition in the second embodiment contains at least an epoxy resin having a partial structure represented by —$C(CF_3)H$—.

As an example, the curable resin composition in the second embodiment contains an epoxy resin having a partial structure represented by —$C(CF_3)H$— and a curing agent. In this case, the composition is cured by the reaction between the epoxy resin and the curing agent.

As another example, the curable resin composition in the second embodiment does not necessarily contain a curing agent. In this case, the epoxy resin becomes to have a high molecular weight due to the cationic polymerization reaction of the epoxy group, whereby the composition is cured.

Hereinafter, components preferably contained in the curable resin composition in the second embodiment, other than the epoxy resin having a partial structure represented by —$C(CF_3)H$—, will be described.

(Curing Agent)

In a case where the curable resin composition in the second embodiment contains a curing agent, the kind of the curing agent is not particularly limited. As the curing agent, it is possible to use a curing agent as exemplified in <Curable resin composition in first embodiment> described above.

Further, as the curing agent, it is possible to use an active ester-based curing agent in addition to the curing agent as exemplified in <Curable resin composition in first embodiment> described above. Specific examples of the active ester-based curing agent include dihydric phenols such as catechol, resorcin, hydroquinone, bisphenol F, bisphenol A, bisphenol AF, bisphenol S, and biphenol, phenol novolaks, cresol novolaks, bisphenol A novolaks, bisphenol AF novolaks, trishydroxyphenylmethanes, and aralkyl polyphenols. Further, the active ester body of the novolak resin of the first embodiment can also be used.

In a case where the curable resin composition in the second embodiment contains a curing agent, it may contain only one curing agent or may contain two or more curing agents having chemical structures different from each other.

In a case where the curable resin composition in the second embodiment contains a curing agent, the amount thereof may be appropriately adjusted in consideration of the epoxy equivalent or the like of the epoxy resin. Typically, in a case where a curing agent is used, the amount thereof is about 0.1 to 1,000 parts by mass with respect to 100 parts by mass of the epoxy resin.

(Curing Accelerator)

The curable resin composition in the second embodiment can contain a curing accelerator. In this case, the curable resin composition in the second embodiment may contain or may not contain a curing agent. In the former case, it is conceived that the bond forming reaction mainly proceeds between the epoxy resin and the curing agent, whereby the composition is cured. In the latter case, it is conceived that the epoxy resins mainly react with each other (the epoxy groups are cationically polymerized), whereby the composition is cured.

As the curing accelerator, it is possible to use a curing accelerator as exemplified in <Curable resin composition in first embodiment> described above.

In a case where the curable resin composition in the second embodiment contains a curing accelerator, it may contain only one curing accelerator or may contain two or more curing accelerators having chemical structures different from each other.

In a case where the curable resin composition in the second embodiment contains a curing accelerator, the amount thereof may be appropriately adjusted. Typically, in a case where a curing accelerator is used, the amount thereof is about 0.001 to 10 parts by mass with respect to 100 parts by mass of the epoxy resin.

(Combined Epoxy Resin)

The curable resin composition in the second embodiment may contain an epoxy resin (a combined epoxy resin) other than the epoxy resin having a partial structure represented by $-C(CF_3)H-$.

Examples of the combined epoxy resin include difunctional epoxy resins, for example, a bisphenol A type epoxy resin, a bisphenol F type epoxy resin, a bisphenol AF type epoxy resin, a bisphenol AD type epoxy resin, a hydrogenated bisphenol A type epoxy resin, a hydrogenated bisphenol F-type epoxy resin, a diglycidyl ether of a bisphenol A-alkylene oxide adduct, a diglycidyl ether of an alkylene oxide adduct of bisphenol F, a bisphenol S type epoxy resin, a tetramethyl bisphenol A type epoxy resin, a tetramethyl bisphenol F type epoxy resin, a thiodiphenol type epoxy resin, a dihydroxydiphenyl ether type epoxy resin, a terpene diphenol type epoxy resin, a biphenol type epoxy resin, a tetramethyl biphenol type epoxy resin, a hydroquinone type epoxy resin, a methylhydroquinone type epoxy resin, a dibutylhydroquinone type epoxy resin, a resorcin type epoxy resin, a methylresorcin type epoxy resin, and a dihydroxynaphthalene type epoxy resin.

Further, examples of the polyfunctional epoxy resin include a phenol novolak type epoxy resin, a cresol novolak type epoxy resin, a bisphenol A novolak type epoxy resin, a bisphenol AF novolak type epoxy resin, a dicyclopentadienephenol type epoxy resin, a terpenephenol type epoxy resin, a phenol aralkyl type epoxy resin, a biphenyl aralkyl type epoxy resin, a naphthol novolak type epoxy resin, polyhydric phenol resins obtained by a condensation reaction with various aldehydes such as hydroxybenzaldehyde, croton aldehyde, and glyoxal, epoxy resins produced from various phenolic compounds such as modified phenolic resins obtained by polycondensing petroleum-based heavy oil or pitches, formaldehyde polymers, and phenols in the presence of an acid catalyst, and epihalohydrin, and triglycidyl isocyanurate.

Further, examples of the combined epoxy resin include epoxy resins produced from various amine compounds such as diaminodiphenylmethane, aminophenol, and xylenediamine, and epihalohydrin, epoxy resins produced from various carboxylic acids such as methylhexahydroxyphthalic acid and dimer acid, and epihalohydrin, a diluent for epoxy resins such as a glycidyl ether of an aliphatic alcohol, and an alicyclic epoxy resin represented by 3,4-epoxycyclohexyl-methyl-3',4'-epoxycyclohexanecarboxylate.

In a case where the curable resin composition in the second embodiment contains a combined epoxy resin, it may contain only one combined epoxy resin or may contain two or more combined epoxy resins having chemical structures different from each other.

In a case where the curable resin composition in the second embodiment contains a combined epoxy resin, the amount thereof is, for example, 1 to 80 parts by mass and preferably 3 to 50 parts by mass with respect to 100 parts by mass of the epoxy resin having a partial structure represented by $-C(CF_3)H-$.

(Other Components)

The curable resin composition in the second embodiment may contain one or more optional components in addition to the above components. As the optional component, it is possible to use the following components; an antioxidant, a filler material (a filler), a coloring agent as exemplified in <Curable resin composition in first embodiment> described above, a resin other than epoxy resin, a curable monomer, an oligomer, an organic solvent, and the like.

The properties of the curable resin composition in the second embodiment are not particularly limited, and the properties exemplified in <Curable resin composition in first embodiment> described above can be taken.

<Curable Resin Composition of Epoxy (Meth)Acrylate Body>

The novolak resin of the first embodiment and the epoxy resin of the second embodiment can be an epoxy (meth)acrylate body as shown in General Formulae (13) to (15). Further, in a case where other components are contained, a curable resin composition can be obtained.

As an example, the curable resin composition of the epoxy (meth)acrylate body contains the epoxy (meth)acrylate body of the novolak resin of the first embodiment and/or the epoxy resin of the second embodiment as well as a photopolymerization initiator. In this case, the composition is cured by the reaction between the (meth)acrylate group and the photopolymerization initiator.

The photopolymerization initiator is not particularly limited as long as it can generate active species such as radicals upon irradiation with high-energy light such as ultraviolet rays and polymerize a polymerizable carbon-carbon double bond. Specific examples thereof include a photoradical polymerization initiator.

In the photoradical polymerization initiator, there is an intramolecular cleavage type in which an intramolecular bond is cleaved to generate a radical and a hydrogen abstraction type in which a hydrogen donor such as a tertiary amine or an ether is used in combination to generate a radical. Any of them can be used in the first embodiment. For example, 2-hydroxy-2-methyl-1-phenylpropane-1-one, which is the intramolecular cleavage type, generates a radical by cleaving a carbon-carbon bond upon irradiation with light. In addition, examples of the hydrogen abstraction type include benzophenone, methyl orthobenzoin benzoate, and 4-benzoyl-4'-methyldiphenylsulfide.

The photoradical polymerization generator is not particularly limited as long as it is a compound that generates a radical by absorbing light, and a commercially available photoradical polymerization initiator can be used. The photoradical polymerization initiator can be purchased from, for example, BASF SE.

The amount of the photopolymerization initiator is typically preferably 0.1% to 10% by mass, more preferably 0.1% to 7% by mass, and still more preferably 0.1% to 5% by mass, in the total non-volatile components of the curable resin composition of the epoxy (meth)acrylate body.

Hereinafter, components preferably contained in the curable resin composition in the second embodiment, other than the epoxy (meth)acrylate body of the novolak resin of the first embodiment and/or the epoxy resin of the second embodiment as well as the photopolymerization initiator, will be described.

(Combined Epoxy (Meth)Acrylate Body)

The curable resin composition of the epoxy (meth)acrylate body may contain an epoxy (meth)acrylate body (a combined epoxy (meth)acrylate body) other than the epoxy (meth)acrylate body of the novolak resin of the first embodiment and/or the epoxy resin of the second embodiment.

Examples of the combined epoxy (meth)acrylate body include epoxy (meth)acrylate bodies, for example, difunctional epoxy resins, for example, a bisphenol A type epoxy resin, a bisphenol F type epoxy resin, a bisphenol AF type epoxy resin, a bisphenol AD type epoxy resin, a hydrogenated bisphenol A type epoxy resin, a hydrogenated bisphenol F-type epoxy resin, a diglycidyl ether of a bisphenol A-alkylene oxide adduct, a diglycidyl ether of an alkylene oxide adduct of bisphenol F, a bisphenol S type epoxy resin, a tetramethyl bisphenol A type epoxy resin, a tetramethyl bisphenol F type epoxy resin, a thiodiphenol type epoxy resin, a dihydroxydiphenyl ether type epoxy resin, a terpene diphenol type epoxy resin, a biphenol type epoxy resin, a tetramethyl biphenol type epoxy resin, a hydroquinone type epoxy resin, a methylhydroquinone type epoxy resin, a dibutylhydroquinone type epoxy resin, a resorcin type epoxy resin, a methylresorcin type epoxy resin, and a dihydroxynaphthalene type epoxy resin.

Further, examples of the polyfunctional epoxy resin include epoxy (meth)acrylate bodies such as a phenol novolak type epoxy resin, a cresol novolak type epoxy resin, a bisphenol A novolak type epoxy resin, a bisphenol AF novolak type epoxy resin, a dicyclopentadienephenol type epoxy resin, a terpenephenol type epoxy resin, a phenol aralkyl type epoxy resin, a biphenyl aralkyl type epoxy resin, a naphthol novolak type epoxy resin, polyhydric phenol resins obtained by a condensation reaction with various aldehydes such as hydroxybenzaldehyde, croton aldehyde, and glyoxal, epoxy resins produced from various phenolic compounds such as modified phenolic resins obtained by polycondensing petroleum-based heavy oil or pitches, formaldehyde polymers, and phenols in the presence of an acid catalyst, and epihalohydrin, and triglycidyl isocyanurate.

Further, examples of the combined epoxy (meth)acrylate body also include epoxy (meth)acrylate bodies such as epoxy resins produced from various amine compounds such as diaminodiphenylmethane, aminophenol, and xylenediamine, and epihalohydrin, epoxy resins produced from various carboxylic acids such as methylhexahydroxyphthalic acid and dimer acid, and epihalohydrin, a diluent for epoxy resins such as a glycidyl ether of an aliphatic alcohol, and an alicyclic epoxy resin represented by 3,4-epoxycyclohexyl-methyl-3',4'-epoxycyclohexanecarboxylate.

The combined epoxy (meth)acrylate body may not be modified or may be modified with an acid.

In a case where the curable resin composition of the epoxy (meth)acrylate body contains a combined epoxy (meth)acrylate body, it may contain only one combined epoxy (meth)acrylate body or may contain two or more combined epoxy (meth)acrylate bodies having chemical structures different from each other.

In a case where the curable resin composition of the epoxy (meth)acrylate body contains a combined epoxy (meth)acrylate body, the amount thereof is, for example, 1 to 80 parts by mass and preferably 3 to 50 parts by mass with respect to 100 parts by mass of the epoxy (meth)acrylate body of the novolak resin of the first embodiment and/or the epoxy resin of the second embodiment.

(Combined Epoxy Resin)

As the combined epoxy resin, the curable resin composition of the epoxy (meth)acrylate body may contain the epoxy body of the novolak resin of the first embodiment and/or the epoxy resin of the second embodiment and may contain an epoxy resin other than the epoxy body of the novolak resin of the first embodiment and/or the epoxy resin of the second embodiment.

Examples of the combined epoxy resin include difunctional epoxy resins, for example, a bisphenol A type epoxy resin, a bisphenol F type epoxy resin, a bisphenol AF type epoxy resin, a bisphenol AD type epoxy resin, a hydrogenated bisphenol A type epoxy resin, a hydrogenated bisphenol F-type epoxy resin, a diglycidyl ether of a bisphenol A-alkylene oxide adduct, a diglycidyl ether of an alkylene oxide adduct of bisphenol F, a bisphenol S type epoxy resin, a tetramethyl bisphenol A type epoxy resin, a tetramethyl bisphenol F type epoxy resin, a thiodiphenol type epoxy resin, a dihydroxydiphenyl ether type epoxy resin, a terpene diphenol type epoxy resin, a biphenol type epoxy resin, a tetramethyl biphenol type epoxy resin, a hydroquinone type epoxy resin, a methylhydroquinone type epoxy resin, a dibutylhydroquinone type epoxy resin, a resorcin type epoxy resin, a methylresorcin type epoxy resin, and a dihydroxynaphthalene type epoxy resin.

Further, examples of the polyfunctional epoxy resin include a phenol novolak type epoxy resin, a cresol novolak type epoxy resin, a bisphenol A novolak type epoxy resin, a bisphenol AF novolak type epoxy resin, a dicyclopentadienephenol type epoxy resin, a terpenephenol type epoxy resin, a phenol aralkyl type epoxy resin, a biphenyl aralkyl type epoxy resin, a naphthol novolak type epoxy resin, polyhydric phenol resins obtained by a condensation reaction with various aldehydes such as hydroxybenzaldehyde, croton aldehyde, and glyoxal, epoxy resins produced from various phenolic compounds such as modified phenolic resins obtained by polycondensing petroleum-based heavy oil or pitches, formaldehyde polymers, and phenols in the presence of an acid catalyst, and epihalohydrin, and triglycidyl isocyanurate.

Further, examples of the combined epoxy resin include epoxy resins produced from various amine compounds such as diaminodiphenylmethane, aminophenol, and xylenediamine, and epihalohydrin, epoxy resins produced from various carboxylic acids such as methylhexahydroxyphthalic acid and dimer acid, and epihalohydrin, a diluent for epoxy resins such as a glycidyl ether of an aliphatic alcohol, and an alicyclic epoxy resin represented by 3,4-epoxycyclohexylmethyl-3',4'-epoxycyclohexanecarboxylate.

In a case where the curable resin composition of the epoxy (meth)acrylate body contains a combined epoxy resin, it may contain only one combined epoxy resin or may contain two or more combined epoxy resins having chemical structures different from each other.

In a case where the curable resin composition of the epoxy (meth)acrylate body contains a combined epoxy resin, the amount thereof is, for example, 1 to 80 parts by mass and preferably 3 to 50 parts by mass with respect to 100 parts by mass of the epoxy (meth)acrylate body of the novolak resin of the first embodiment and/or the epoxy resin of the second embodiment.

(Curing Agent)

In a case where the curable resin composition of the epoxy (meth)acrylate body contains a combined epoxy resin, it may contain a curing agent, and the kind of the curing agent, in that case, is not particularly limited. As the curing agent, it is possible to use a curing agent as exemplified in <Curable resin composition in first embodiment> described above.

In a case where the curable resin composition of the epoxy (meth)acrylate body contains a curing agent, it may contain only one curing agent or may contain two or more curing agents having chemical structures different from each other.

In a case where the curable resin composition of the epoxy (meth)acrylate body contains a curing agent, the amount thereof is about 0.1 to 1,000 parts by mass with respect to 100 parts by mass of the combined epoxy resin.

(Curing Accelerator)

In a case where the curable resin composition of the epoxy (meth)acrylate body contains a combined epoxy resin, it can contain a curing accelerator. In this case, the curable resin composition of the epoxy (meth)acrylate body may contain or may not contain a curing agent.

As the curing accelerator, it is possible to use a curing accelerator as exemplified in <Curable resin composition in first embodiment> described above.

In a case where the curable resin composition of the epoxy (meth)acrylate body contains a curing accelerator, it may contain only one curing accelerator or may contain two or more curing accelerators having chemical structures different from each other.

In a case where the curable resin composition of the epoxy (meth)acrylate body contains a curing accelerator, the amount thereof may be appropriately adjusted. Typically, in a case where a curing accelerator is used, the amount thereof is about 0.001 to 10 parts by mass with respect to 100 parts by mass of the combined epoxy resin.

(Other Components)

The curable resin composition of the epoxy (meth)acrylate body may contain one or more optional components in addition to the above components. As the optional component, it is possible to use the following components; an antioxidant, a filler material (a filler), a coloring agent as exemplified in <Curable resin composition in first embodiment> described above, a resin other than epoxy resin, a curable monomer, an oligomer, an organic solvent, and the like.

The properties of the curable resin composition of the epoxy (meth)acrylate body are not particularly limited, and the properties exemplified in <Curable resin composition in first embodiment> described above can be taken.

<Cured Substance, Optical Member, and Electronic Device>

A cured substance can be obtained by curing the curable resin composition. Curing can be carried out by light and/or heat.

More specifically, the curable resin composition is generally heated at 100° C. to 200° C. for 0.1 to 20 minutes. This makes it possible to obtain a cured substance. In order to improve the curing performance, "post-curing" may be carried out in a range of 70° C. to 200° C. for 0.1 to 10 hours.

The form of the cured substance can be a molded body, a cast product, a laminate having a cured film formed on one side or both sides of some kind of base material, a film, a base resin for a biomaterial, or the like.

The cured substance obtained by curing the curable resin composition has good transparency. From the viewpoint of this transparency, it is preferable to manufacture an optical member using the curable resin composition (manufacture an optical member containing a cured substance of the curable resin composition).

For example, it is possible to use the curable resin composition as a transparent material for encapsulating optical elements such as an optical sensor and an image pickup element. Further, it is possible to use the curable resin composition for manufacturing a microlens and as an optical adhesive.

An electronic device may be manufactured using the curable resin composition. That is, an electronic device containing the cured substance may be manufactured. It is conceived that the cured substance has not only good transparency but also good dielectric characteristics (tends to have a low dielectric constant and a low dielectric loss tangent) since it contains a fluorine atom. Good dielectric characteristics are preferred characteristics for application to electronic devices.

As an example, it is possible to use the above-described curable resin composition as a material for encapsulating electronic components. That is, in a case of encapsulating electronic components with a melt obtained by heating the curable resin composition, it is possible to manufacture an electronic device in which the electronic components are encapsulated by the cured substance.

As another example, it is possible to manufacture a curable material for lamination by coating and/or impregnating a base material (preferably a fiber base material) such as glass fiber, carbon fiber, polyester fiber, polyamide fiber, or paper with the curable resin composition. This curable material for lamination can be suitably used in the manufacture of a printed wiring board such as a multilayer electric laminated board, a build-up laminated board, and a flexible laminated board.

As still another example, it is possible to provide an insulating film by coating a substrate on which a circuit is formed with a varnish-shaped curable resin composition to form a resin film and then curing the resin film.

The embodiments of the present invention have been described above; however, these are examples of the present invention, and thus it is possible to adopt various configurations other than the above. In addition, the present invention is not limited to the embodiments described above and modifications, improvements, and the like are included in the present invention in a range in which it is possible to achieve the purpose of the present invention.

EXAMPLES

The aspects of the present invention will be described in more detail based on Examples and Comparative Examples. It is surely noted that the present invention is not limited to only Examples.

In the following, the weight average molecular weight Mw and the number average molecular weight Mn were measured using gel permeation chromatography (GPC, HLC-8320 manufactured by Tosoh Corporation).

Tetrahydrofuran (THF) was used as the mobile phase, and TSKgel SuperHZ (3000×1+2000×2)/(6.0 mm I.D.×15 cm×3) was used as the column.

The epoxy equivalent was measured based on JIS K 7236: 2009. The hydroxyl group equivalent was calculated by measuring the hydroxyl group value based on JIS K 0070: 1992.

For the solid content acid value, the acid value of the solution was measured based on JIS K 0070: 1992, and the solid content acid value was calculated from the concentration of solid contents.

The concentration of solid contents was calculated by dividing the mass of the reaction substrate from which the solvent was excluded, by the total mass of the solution containing the solvent.

Preparation Example of Catalyst for Fluoral Synthesis 896 g of the special grade reagent $CrCl_3 \cdot 6H_2O$ was dissolved in pure water to prepare a solution of 3.0 L. 400 g of particulate alumina was immersed in this solution and allowed to stand for a whole day and night. The solution after standing was filtered to take out alumina, and the alumina was kept at 100° C. in a hot air circulation type dryer and further dried for a whole day and night. In this way, chromium-supported alumina was obtained.

A cylindrical reaction tube made of SUS316L (diameter: 4.2 cm, length: 60 cm), equipped with an electric furnace, was filled with the obtained chromium-supported alumina. The chromium-supported alumina was heated to 300° C. while allowing nitrogen gas to flow through this reaction tube at a flow rate of about 20 mL/min. At the time when no water outflow was observed from the reaction tube, hydrogen fluoride was accompanied by nitrogen gas, and the concentration thereof was gradually increased. The reactor temperature was raised to 350° C. at the timing when the hot spot due to the fluorination of the chromium-supported alumina with which filling had been carried out reached the outlet end of the reaction tube, and the state was maintained for 5 hours. In this way, a catalyst for fluoral synthesis was obtained. Hereinafter, this catalyst will be referred to as a "catalyst A".

Preparation Example of Fluoral

A gas phase reaction device (manufactured of SUS316L, diameter: 2.5 cm, length: 40 cm) having a cylindrical reaction tube, equipped with an electric furnace, was filled with 125 mL of the catalyst A.

The temperature of the reaction tube was raised to 280° C. while the air was allowed to flow through the gas phase reaction device at a flow rate of about 100 mL/min, and hydrogen fluoride was introduced at a rate of about 0.32 g/min for 1 hour.

Then, chloral (trichloroethanal) was started to be supplied to the reaction tube at a rate of about 0.38 g/min (contact time: 15 seconds). The reaction was stabilized 1 hour after the start of the reaction. After the reaction was stabilized, the gas flowing out of the reactor was captured over 18 hours in a cylinder made of SUS304 having a blowing tube cooled with a refrigerant at −15° C.

484.8 g of the fluoral-containing captured liquid obtained here was subjected to titration to calculate the hydrogen fluoride content, the hydrogen chloride content, and the organic substance content. As a result of the calculation, the hydrogen fluoride content was 40% by mass, the hydrogen chloride content was 11% by mass, and the organic substance content was 49% by mass, and the recovery rate of the organic substance was 88% (based on the number of moles of the supplied raw material chloral). Further, as a result of collecting a part of the recovered organic substance in an NMR tube made of resin and checking the degree of fluorination by $^{19}F$-NMR, it was confirmed that low-order fluorinated substances are almost undetected, and thus fluorination proceeds quantitatively.

Next, 150 g of a part of the captured fluoral-containing mixture (hydrogen fluoride: 40% by mass, hydrogen chloride: 11% by mass, organic substance: 49% by mass) was charged into a 500 ml reactor made of SUS, which was equipped with a cooling tube through which a refrigerant at −15° C. passed through, a thermometer, and a stirrer, and then the reactor was heated to 25° C. While refluxing hydrogen fluoride in the cooling tube under normal pressure, hydrogen chloride passing through the top tower of the cooling tube was removed by being absorbed in water. After 5 hours of reflux, sampling was carried out from the reactor, and the obtained sample was titrated to calculate the hydrogen fluoride content, the hydrogen chloride content, and the organic substance content. As a result of the calculation, the hydrogen fluoride content was 44% by mass, the hydrogen chloride content was 1% by mass, and the organic substance content was 55% by mass. In this sample (mixture), 1,2,2,2-tetrafluoroethanol, hydrogen fluoride, and fluoral coexist in an equilibrium state.

[Physical Property Data]

1,2,2,2-Tetrafluoroethanol $^{19}F$-NMR (400 MHz, $CFCl_3$) δ (ppm): −85.82 (3F, s), −137.95 (1F, d, J=54.9 Hz)

Hydrogen Fluoride:

$^{19}F$-NMR (400 MHz, $CFCl_3$) δ (ppm): −193.37 (1F, s)

Synthesis of Novolak Resin

Synthesis Example 1: Synthesis of Novolak Resin Having Following Structural Unit

[Chemical 27]

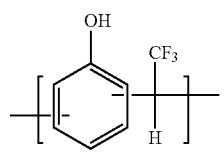

In a 100 mL stainless steel autoclave reactor equipped with a pressure gauge, a thermometer protection tube, an insertion tube, and a stirring motor, 29.6 g (fluoral: 0.167 mol, hydrogen fluoride: 0.651 mol) of the fluoral-containing mixture obtained in [Preparation example of fluoral] described above (hydrogen fluoride: 44% by mass, hydrogen chloride: 1% by mass, organic substance: 55% by mass), 20.3 g (1.02 mol) of hydrogen fluoride, 15.7 g (0.167 mol) of phenol, and 39.2 g of 1,2-dichloroethane were placed. Then, the reaction was carried out at 25° C. and an absolute pressure of 0.2 MPa for 24 hours.

Then, the reaction solution was poured into 200 g of ice water, and the organic substance was extracted with 200 g of ethyl acetate. The organic layer recovered by the extraction operation was washed twice with 200 g of water and further washed with 50 g of saturated aqueous sodium hydrogen carbonate. Then, the organic layer was recovered by a liquid separation operation. The organic layer was concentrated with an evaporator to obtain 31.0 g of a crude novolak resin. The obtained crude novolak resin was dissolved in 30 g of methanol and gradually poured into a large beaker containing 300 g of strongly stirred water to precipitate the novolak resin. The solid was recovered by filtration and dried in a vacuum dryer at 80° C. for 5 hours under reduced pressure. From the above, 26.3 g of a target novolak resin was obtained.

[Physical Property Data]

Number average molecular weight (Mn)=1,184, weight average molecular weight (Mw)=3,182, polydispersity (Mw/Mn)=2.688

Synthesis Example 2: Synthesis of Novolak Resin Having Following Structural Unit

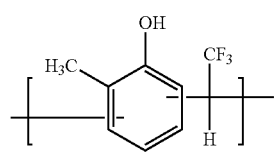

[Chemical 28]

In a 100 mL stainless steel autoclave reactor equipped with a pressure gauge, a thermometer protection tube, an insertion tube, and a stirring motor, 24.8 g (fluoral: 0.139=1, hydrogen fluoride: 0.55 mol) of the fluoral-containing mixture obtained in [Preparation example of fluoral] described above (hydrogen fluoride: 44% by mass, hydrogen chloride: 1% by mass, organic substance: 55% by mass), 16.9 g (0.85 mol) of hydrogen fluoride, 15.0 g (0.139 mol) of 2-cresol, and 37.6 g of 1,2-dichloroethane were placed. Then, heating was carried out to an internal temperature of 80° C. using a water bath, and the reaction was carried out under an absolute pressure of 0.4 MPa for 1 hour. Subsequent reaction termination and purification were carried out in the same manner as in Synthesis Example 1. From the above, 24.1 g of a target novolak resin was obtained.

[Physical Property Data]

Number average molecular weight (Mn)=2,882, weight average molecular weight (Mw)=9,304, polydispersity (Mw/Mn)=3.228.

Synthesis Example 3: Synthesis of Novolak Resin Having Following Structural Unit

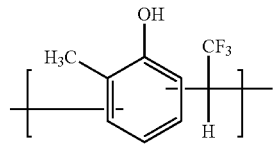

[Chemical 29]

In a 100 mL stainless steel autoclave reactor equipped with a pressure gauge, a thermometer protection tube, an insertion tube, and a stirring motor, 29.8 g (fluoral: 0.167 mol, hydrogen fluoride: 0.656 mol) of the fluoral-containing mixture obtained in [Preparation example of fluoral] described above (hydrogen fluoride: 44% by mass, hydrogen chloride: 1% by mass, organic substance: 55% by mass), 53.6 g (26.8 mol) of hydrogen fluoride, and 18.0 g (0.167 mol) of 2-cresol were placed. Then, the reaction was carried out at 25° C. and an absolute pressure of 0.2 MPa for 3 hours. The reaction product was dissolved in 300 g of ethyl acetate and poured into 200 g of ice water. Subsequent purification was carried out in the same manner as in Synthesis Example 1. From the above, 25.2 g of a target novolak resin was obtained.

[Physical Property Data]

Number average molecular weight (Mn)=729, weight average molecular weight (Mw)=2,252, polydispersity (Mw/Mn)=3.091.

Synthesis Example 4: Synthesis of Novolak Resin Having Following Structural Unit

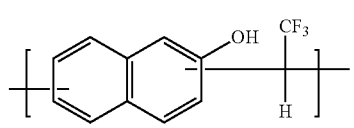

[Chemical 30]

In a 100 mL stainless steel autoclave reactor equipped with a pressure gauge, a thermometer protection tube, an insertion tube, and a stirring motor, 23.8 g (fluoral: 0.133 mol, hydrogen fluoride: 0.524 mol) of the fluoral-containing mixture obtained in [Preparation example of fluoral] described above (hydrogen fluoride: 44% by mass, hydrogen chloride: 1% by mass, organic substance: 55% by mass), 16.2 g (0.81 mol) of hydrogen fluoride, 19.2 g (0.133 mol) of 2-naphthol, and 38.4 g of 1,2-dichloroethane were placed. Then, the reaction was carried out at 25° C. and an absolute pressure of 0.2 MPa for 24 hours. Subsequent reaction termination and purification were carried out in the same manner as in Synthesis Example 1. From the above, 22.4 g of a target novolak resin was obtained.

[Physical Property Data]

Number average molecular weight (Mn)=598, weight average molecular weight (Mw)=1,182, polydispersity (Mw/Mn)=1.975.

Synthesis Example 5: Synthesis of Novolak Resin Having Following Structural Unit

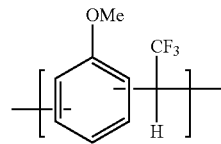
[Chemical 31]

In a 100 mL stainless steel autoclave reactor equipped with a pressure gauge, a thermometer protection tube, an insertion tube, and a stirring motor, 29.6 g (fluoral: 0.166 mol, hydrogen fluoride: 0.65 mol) of the fluoral-containing mixture obtained in [Preparation example of fluoral] described above (hydrogen fluoride: 44% by mass, hydrogen chloride: 1% by mass, organic substance: 55% by mass), 20.0 g (1.0 mol) of hydrogen fluoride, 18.0 g (0.166 mol) of anisole, and 39.2 g of 1,2-dichloroethane were placed. Then, the reaction was carried out at 25° C. and an absolute pressure of 0.2 MPa for 5 hours. Subsequent reaction termination and purification were carried out in the same manner as in Synthesis Example 1. From the above, 30.0 g of a target novolak resin was obtained.

[Physical Property Data]

Number average molecular weight (Mn)=1,326, weight average molecular weight (Mw)=3,627, polydispersity (Mw/Mn)=2.735.

(Synthesis Example 6: Synthesis of Novolak Resin Having Following Structural Unit (Two Kinds))

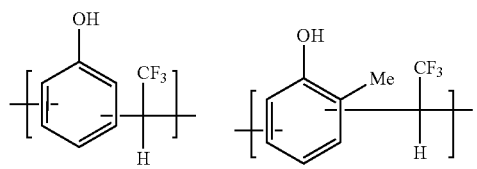
[Chemical 32]

In a 100 mL stainless steel autoclave reactor equipped with a pressure gauge, a thermometer protection tube, an insertion tube, and a stirring motor, 29.6 g (fluoral: 0.166 mol, hydrogen fluoride: 0.65 mol) of the fluoral-containing mixture obtained in [Preparation example of fluoral] described above (hydrogen fluoride: 44% by mass, hydrogen chloride: 1% by mass, organic substance: 55% by mass), 20.0 g (1.0 mol) of hydrogen fluoride, 7.8 g (83 mmol) of phenol, 9.0 g (83 mmol) of 2-cresol, and 39.2 g of 1,2-dichloroethane were placed. Then, the reaction was carried out at 25° C. and an absolute pressure of 0.2 MPa for 18 hours. Subsequent reaction termination and purification were carried out in the same manner as in Synthesis Example 1. From the above, 29.2 g of a target novolak resin was obtained.

[Physical Property Data]

Number average molecular weight (Mn)=1,600, weight average molecular weight (Mw)=4,380, polydispersity (Mw/Mn)=2.737

Synthesis Example G: Synthesis of Novolak Resin Having Following Structural Unit

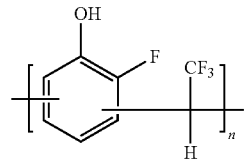
[Chemical 33]

In a 100 mL stainless steel autoclave reactor equipped with a pressure gauge, a thermometer protection tube, an insertion tube, and a stirring motor, 37.1 g (fluoral: 0.205 mol, hydrogen fluoride: 0.816 mol) of the fluoral-containing mixture obtained in [Preparation example of fluoral] describe above, 33.0 g (1.69 mol) of hydrogen fluoride, and 30.6 g (0.273 mol) of 2-fluorophenol were placed. Then, the internal temperature was set to 60° C. with a water bath, and the reaction was carried out under an absolute pressure of 0.3 MPa for 20 hours. After completion of the reaction, the reaction solution was poured into 200 g of ice water, and the organic substance was extracted with 200 g of diisopropyl ether. The organic layer recovered by the extraction operation was washed with 200 g of water, and further, 200 g of water and potassium hydrogen carbonate were added thereto to be neutralized and washed. Then, washing was carried out with 200 g of water, and the organic layer was recovered by a liquid separation operation. The organic layer was concentrated with an evaporator to obtain 42.8 g of a novolak resin.

[Physical Property Data]

Number average molecular weight (Mn)=960, weight average molecular weight (Mw)=1,254, polydispersity (Mw/Mn)=1.3

Synthesis Example H: Synthesis of Novolak Resin Having Following Structural Unit

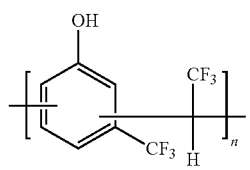
[Chemical 34]

In a 100 mL stainless steel autoclave reactor equipped with a pressure gauge, a thermometer protection tube, an insertion tube, and a stirring motor, 38.5 g (fluoral: 0.216 mol, hydrogen fluoride: 0.847 mol) of the fluoral-containing mixture obtained in [Preparation example of fluoral] describe above, 35.1 g (1.76 mol) of hydrogen fluoride, and 39.0 g (0.241 mol) of 3-hydroxybenzotrifluoride were placed. Then, the internal temperature was set to 60° C. with a water bath, and the reaction was carried out under an absolute pressure of 0.4 MPa for 20 hours. After completion of the reaction, the reaction solution was poured into 200 g of ice water, and the organic substance was extracted with 200 g of diisopropyl ether. The organic layer recovered by the extraction operation was washed with 200 g of water, and further, 200 g of water and potassium hydrogen carbonate were added thereto to be neutralized and washed. Then, washing was carried out with 200 g of water, and the organic layer was recovered by a liquid separation operation. The organic layer was concentrated with an evaporator to obtain 44.8 g of a novolak resin.

[Physical Property Data]

Number average molecular weight (Mn)=702, weight average molecular weight (Mw)=951, polydispersity (Mw/Mn)=1.3

Synthesis Example I: Synthesis of Novolak Resin Having Following Structural Unit

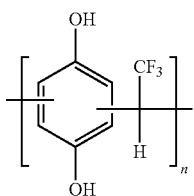

[Chemical 35]

In a 100 mL stainless steel autoclave reactor equipped with a pressure gauge, a thermometer protection tube, an insertion tube, and a stirring motor, 30.4 g (fluoral: 0.170 mol, hydrogen fluoride: 0.668 mol) of the fluoral-containing mixture obtained in [Preparation example of fluoral] describe above, 17.2 g (0.862 mol) of hydrogen fluoride, and 25.0 g (0.227 mol) of hydroquinone were placed. Then, the reaction was carried out at 25° C. and an absolute pressure of 0.2 MPa for 24 hours. After completion of the reaction, the reaction solution was poured into 200 g of ice water, and the organic substance was extracted with 200 g of methyl isobutyl ketone. The organic layer recovered by the extraction operation was washed with 200 g of water, and further, 200 g of water and potassium hydrogen carbonate were added thereto to be neutralized and washed. Then, washing was carried out with 200 g of water, and the organic layer was recovered by a liquid separation operation. The organic layer was concentrated with an evaporator to obtain 37.5 g of a novolak resin.

[Physical Property Data]

Number average molecular weight (Mn)=850, weight average molecular weight (Mw)=983, polydispersity (Mw/Mn)=1.2

Comparative Synthesis Example 1: Synthesis of Novolak Resin Having Following Structural Unit

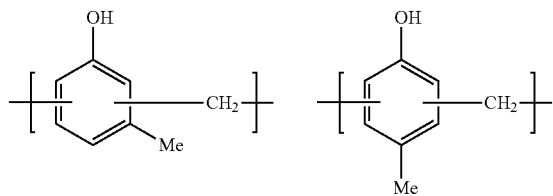

[Chemcial 36]

Into a 100 mL glass flask equipped with a stirrer, a reflux device, a vacuum distillation device, and a thermometer, 32.4 g (0.30 mol) of 3-cresol, 21.6 g (0.20 mol) of 4-cresol, 0.13 g of oxalic acid (1.4 mmol), 11.5 g (0.38 mol) of paraformaldehyde (purity: 90%), and 14.3 g of water were charged. Then, heating was carried out to an internal temperature of 100° C. with a water bath, and the reaction was carried out for 2 hours.

The reaction solution after the completion of the reaction was heated to an internal temperature of 200° C. with an oil bath under normal pressure, and water was distilled off for 2 hours to carry out dehydration. Then, heating was carried out to 230° C., and distillation was carried out under reduced pressure at an absolute pressure of 0.1 kPa for 6 hours to remove low boiling point components. After cooling, 40.0 g of a desired novolak resin was obtained.

[Physical Property Data]

Number average molecular weight (Mn)=1,681, weight average molecular weight (Mw)=8,310, polydispersity (Mw/Mn)=4.943.

Synthesis Example 11: Synthesis of Novolak Resin Having Following Structural Unit

[Chemical 37]

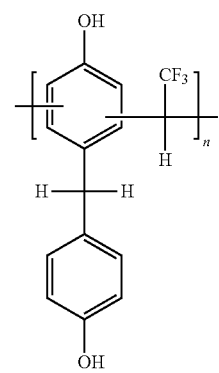

(20)

In a 100 mL stainless steel autoclave reactor equipped with a pressure gauge, a thermometer protection tube, an insertion tube, and a stirring motor, 24.8 g (fluoral: 0.139 mol, hydrogen fluoride: 0.55 mol) of the fluoral-containing mixture obtained in [Preparation example of fluoral] described above (hydrogen fluoride: 44% by mass, hydrogen chloride: 1% by mass, organic substance: 55% by mass), 16.9 g (0.85 mol) of hydrogen fluoride, and 40.9 g (0.204 mol) of 4,4'-dihydroxyphenylmethane (bisphenol F) were placed. Then, the reaction was carried out at an internal temperature of 25° C. under an absolute pressure of 0.2 MPa for 24 hours. Subsequent reaction termination and purification were carried out in the same manner as in Synthesis Example 1. From the above, 41.2 g of a target novolak resin was obtained. The hydroxyl group equivalent of this novolak resin was 161 g/equivalent.

[Physical Property Data]

Number average molecular weight (Mn)=819, weight average molecular weight (Mw)=1,612, polydispersity (Mw/Mn)=1.969

Synthesis Example 12: Synthesis of Novolak Resin Having Following Structural Unit

[Chemical 38]

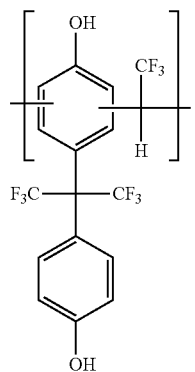

(21)

In a 100 mL stainless steel autoclave reactor equipped with a pressure gauge, a thermometer protection tube, an insertion tube, and a stirring motor, 24.8 g (fluoral: 0.139 mol, hydrogen fluoride: 0.55 mol) of the fluoral-containing mixture obtained in [Preparation example of fluoral] described above (hydrogen fluoride: 44% by mass, hydrogen chloride: 1% by mass, organic substance: 55% by mass), 16.9 g (0.85 mol) of hydrogen fluoride, and 53.8 g (0.160 mol) of 2,2-bis(4-hydroxyphenyl)hexafluoropropane (bisphenol AF) were placed. Then, the reaction was carried out at an internal temperature of 60° C. under an absolute pressure of 0.4 MPa for 4 hours. Subsequent reaction termination and purification were carried out in the same manner as in Synthesis Example 1. From the above, 57.2 g of a target novolak resin was obtained. The hydroxyl group equivalent of this novolak resin was 253 g/equivalent.

[Physical Property Data]

Number average molecular weight (Mn)=954, weight average molecular weight (Mw)=2,093, polydispersity (Mw/Mn)=2.194

<Synthesis of Epoxy Resin>

Synthesis Example A: Production of Epoxy Resin Having Following Structural Unit

[Chemical 39]

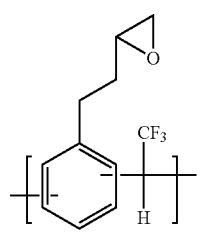

Novolak Resin Synthesis

In a 100 mL stainless steel autoclave reactor equipped with a pressure gauge, a thermometer protection tube, an insertion tube, and a stirring motor, 38.5 g (fluoral: 0.216 mol, hydrogen fluoride: 0.847 mol) of the fluoral-containing mixture obtained in [Preparation example of fluoral] describe above, 35.1 g (1.76 mol) of hydrogen fluoride, and 27.0 g (0.287 mol) of phenol were placed. Then, the reaction was carried out at 25° C. and an absolute pressure of 0.2 MPa for 24 hours.

After completion of the reaction, the reaction solution was poured into 500 g of ice water, and the organic substance was extracted with 500 g of ethyl acetate. The organic layer recovered by the extraction operation was washed with 500 g of water, and further, 500 g of water and 20 g of potassium hydrogen carbonate were added thereto to be neutralized and washed. Then, washing was carried out with 500 g of water, and the organic layer was recovered by a liquid separation operation. The organic layer was concentrated with an evaporator to obtain 42.1 g of a novolak resin. The hydroxyl group equivalent of this novolak resin was 170 g/equivalent.

Epoxy Resin Synthesis

Into a 300 mL glass flask equipped with a stirrer, a dropping funnel, and a thermometer, 35 g of the novolak resin (hydroxyl group equivalent: 170 g/equivalent) obtained as described above, 189.7 g of epichlorohydrin (2.05 mol), and 19 g of 1-butanol were charged, and heating was carried out to an internal temperature of 50° C. with a water bath. Then, 45.1 g (0.226 mol) of a 20% by mass sodium hydroxide aqueous solution was added dropwise into the flask over 3 hours. Then, the inside of the flask was kept at 50° C. for 1 hour to complete the reaction.

After the reaction was completed, the organic layer was recovered by a liquid separation operation and washed 3 times with 100 g of water. Then, the organic layer was recovered by a liquid separation operation and concentrated with an evaporator to obtain a crude epoxy resin.

Into a 300 mL glass flask equipped with a stirrer and a thermometer, the above crude epoxy resin, 150 g of methyl isobutyl ketone, 25 g of 1-butanol, and 38 g of a 20% by mass sodium hydroxide aqueous solution were charged, and heating was carried out to an internal temperature of 80° C. with a water bath, thereby being subjected to an alkali treatment for 2 hours. Then, the organic layer was recovered by a liquid separation operation and washed with 100 g of water three times. Then, the organic layer was recovered by a liquid separation operation and concentrated with an evaporator to obtain 49.5 g of a target epoxy resin. The epoxy equivalent was 310 g/equivalent.

[Physical Property Data]

Number average molecular weight (Mn)=809, weight average molecular weight (Mw)=1,308, polydispersity (Mw/Mn)=1.62

Synthesis Example B: Production of Epoxy Resin Having Following Structural Unit

[Chemcial 40]

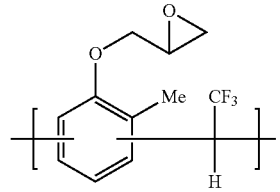

Novolak Resin Synthesis

In a 100 mL stainless steel autoclave reactor equipped with a pressure gauge, a thermometer protection tube, an insertion tube, and a stirring motor, 36.9 g (fluoral: 0.207 mol, hydrogen fluoride: 0.812 mol) of the fluoral-containing mixture obtained in [Preparation example of fluoral] describe above, 33.68 g (1.68 mol) of hydrogen fluoride, and 29.7 g (0.275 mol) of 2-cresol were placed. Then, the reaction was carried out at 25° C. and an absolute pressure of 0.2 MPa for 24 hours. After completion of the reaction, the same operation as in Synthesis Example A was carried out to obtain 42.1 g of a novolak resin. The hydroxyl group equivalent was 183 g/equivalent.

Epoxy Resin Synthesis

Into a 300 mL glass flask equipped with a stirrer, a dropping funnel, and a thermometer, 35 g of the novolak resin (hydroxyl group equivalent: 183 g/equivalent) obtained as described above, 177.0 g of epichlorohydrin (1.91 mol), and 17.7 g of 1-butanol were charged, and heating was carried out to an internal temperature of 50° C. with a water bath. Then, 42.1 g (0.211 mol) of a 20% by mass sodium hydroxide aqueous solution was added dropwise into the flask over 3 hours. Then, the same operation as in Synthesis Example A was carried out to obtain 46.8 g of a target epoxy resin. The epoxy equivalent was 391 g/equivalent.

[Physical Property Data]

Number average molecular weight (Mn)=849, weight average molecular weight (Mw)=1,090, polydispersity (Mw/Mn)=1.28

Synthesis Example C: Production of Epoxy Resin Having Following Structural Unit

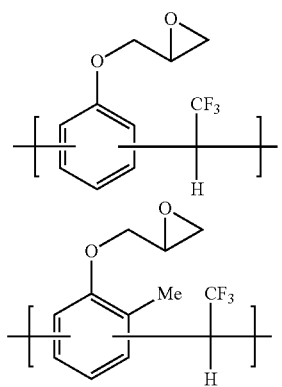

[Chemical 41]

Novolak Resin Synthesis

In a 100 mL stainless steel autoclave reactor equipped with a pressure gauge, a thermometer protection tube, an insertion tube, and a stirring motor, 37.8 g (fluoral: 0.212 mol, hydrogen fluoride: 0.65 mol) of the fluoral-containing mixture obtained in [Preparation example of fluoral] describe above, 34.2 g (1.7 mol) of hydrogen fluoride, 13.3 g (0.141 mol) of phenol, and 15.2 g (0.141 mol) of 2-cresol were placed. Then, the reaction was carried out at 25° C. and an absolute pressure of 0.2 MPa for 18 hours. After completion of the reaction, the same operation as in Synthesis Example A was carried out to obtain 40.2 g of a desired novolak resin. The hydroxyl group equivalent was 169 g/equivalent.

Epoxy Resin Synthesis

Into a 300 mL glass flask equipped with a stirrer, a dropping funnel, and a thermometer, 30 g of the obtained novolak resin (hydroxyl group equivalent: 169 g/equivalent), 164.7 g of epichlorohydrin (1.78 mol), and 16.5 g of 1-butanol were charged, and heating was carried out to an internal temperature of 50° C. with a water bath. Then, 39.2 g (0.196 mol) of a 20% by mass sodium hydroxide aqueous solution was added dropwise into the flask over 3 hours. Then, the same operation as in Synthesis Example A was carried out to obtain 40.8 g of a target epoxy resin. The epoxy equivalent was 326 g/equivalent.

[Physical Property Data]

Number average molecular weight (Mn)=891, weight average molecular weight (Mw)=1,238, polydispersity (Mw/Mn)=1.39

Synthesis Example D: Production of Epoxy Resin Having Following Structural Unit

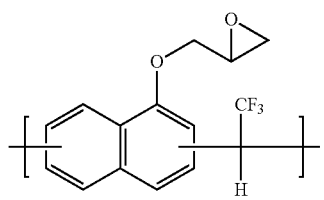

[Chemcial 42]

Novolak Resin Synthesis

In a 100 mL stainless steel autoclave reactor equipped with a pressure gauge, a thermometer protection tube, an insertion tube, and a stirring motor, 34.0 g (fluoral: 0.191 mol, hydrogen fluoride: 0.748 mol) of the fluoral-containing mixture obtained in [Preparation example of fluoral] describe above, 30.7 g (1.54 mol) of hydrogen fluoride, and 36.5 g (0.253 mol) of 1-naphthol were placed. Then, the reaction was carried out at 25° C. and an absolute pressure of 0.2 MPa for 24 hours. After completion of the reaction, the same operation as in Synthesis Example A was carried out to obtain 51.1 g of a novolak resin. Then, the obtained novolak resin was further dissolved in 50 g of ethyl acetate and added dropwise into 1.5 kg of heptane that was strongly stirred, whereby the solid was precipitated. The solid was filtered, and the solvent was distilled off with an evaporator to obtain 28.4 g of a desired novolak resin. The hydroxyl group equivalent was 329 g/equivalent.

Epoxy Resin Synthesis

Into a 300 mL glass flask equipped with a stirrer, a dropping funnel, and a thermometer, 24 g of the obtained novolak resin (hydroxyl group equivalent: 329 g/equivalent), 67.5 g of epichlorohydrin (0.730 mol), and 6.7 g of 1-butanol were charged, and heating was carried out to an internal temperature of 50° C. with a water bath. Then, 16.0 g (80 mmol) of a 20% by mass sodium hydroxide aqueous solution was added dropwise into the flask over 3 hours. Then, the same operation as in Synthesis Example A was carried out to obtain 27.9 g of a target epoxy resin. The epoxy equivalent was 803 g/equivalent.

[Physical Property Data]

Number average molecular weight (Mn)=951, weight average molecular weight (Mw)=1,412, polydispersity (Mw/Mn)=1.49

Synthesis Example E: Production of Epoxy Resin Having Following Structural Unit

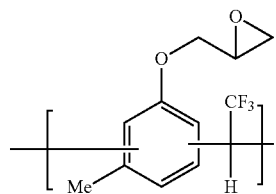

[Chemical 43]

Novolak Resin Synthesis

In a 100 mL stainless steel autoclave reactor equipped with a pressure gauge, a thermometer protection tube, an insertion tube, and a stirring motor, 36.9 g (fluoral: 0.207 mol, hydrogen fluoride: 0.812 mol) of the fluoral-containing mixture obtained in [Preparation example of fluoral] describe above, 33.68 g (1.68 mol) of hydrogen fluoride, and 29.7 g (0.275 mol) of 3-cresol were placed. Then, the reaction was carried out at 25° C. and an absolute pressure of 0.2 MPa for 24 hours. After completion of the reaction, the same operation as in Synthesis Example A was carried out to obtain 42.1 g of a novolak resin. The hydroxyl group equivalent was 180 g/equivalent.

Epoxy Resin Synthesis

Into a 300 mL glass flask equipped with a stirrer, a dropping funnel, and a thermometer, 35 g of the novolak resin (hydroxyl group equivalent: 180 g/equivalent) obtained as described above, 177.0 g of epichlorohydrin (1.91 mol), and 17.7 g of 1-butanol were charged, and heating was carried out to an internal temperature of 50° C. with a water bath. Then, 42.1 g (0.211 mol) of a 20% by mass sodium hydroxide aqueous solution was added dropwise into the flask over 3 hours. Then, the same operation as in Synthesis Example A was carried out to obtain 45.8 g of a target epoxy resin. The epoxy equivalent was 390 g/equivalent.

[Physical Property Data]

Number average molecular weight (Mn)=860, weight average molecular weight (Mw)=1,100, polydispersity (Mw/Mn)=1.30

Synthesis Example F: Production of Epoxy Resin Having Following Structural Unit

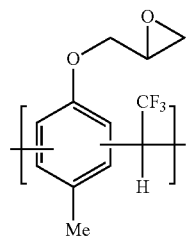

[Chemical 44]

Novolak Resin Synthesis

In a 100 mL stainless steel autoclave reactor equipped with a pressure gauge, a thermometer protection tube, an insertion tube, and a stirring motor, 36.9 g (fluoral: 0.207 mol, hydrogen fluoride: 0.812 mol) of the fluoral-containing mixture obtained in [Preparation example of fluoral] describe above, 33.68 g (1.68 mol) of hydrogen fluoride, and 29.7 g (0.275 mol) of 4-cresol were placed. Then, the reaction was carried out at 25° C. and an absolute pressure of 0.2 MPa for 24 hours. After completion of the reaction, the same operation as in Synthesis Example A was carried out to obtain 40.1 g of a novolak resin. The hydroxyl group equivalent was 185 g/equivalent.

Epoxy Resin Synthesis

Into a 300 mL glass flask equipped with a stirrer, a dropping funnel, and a thermometer, 35 g of the novolak resin (hydroxyl group equivalent: 185 g/equivalent) obtained as described above, 177.0 g of epichlorohydrin (1.91 mol), and 17.7 g of 1-butanol were charged, and heating was carried out to an internal temperature of 50° C. with a water bath. Then, 42.1 g (0.211 mol) of a 20% by mass sodium hydroxide aqueous solution was added dropwise into the flask over 3 hours. Then, the same operation as in Synthesis Example A was carried out to obtain 47.1 g of a target epoxy resin. The epoxy equivalent was 395 g/equivalent.

[Physical Property Data]

Number average molecular weight (Mn)=844, weight average molecular weight (Mw)=1,095, polydispersity (Mw/Mn)=1.28

Synthesis Example J: Synthesis of Epoxy Resin Having Following Structural Unit

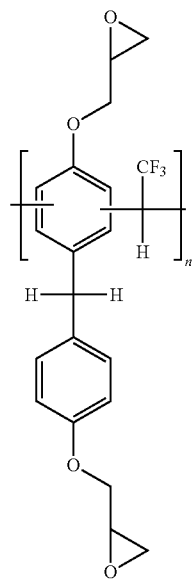

[Chemical 45]

Into a 100 mL glass flask equipped with a stirrer, a dropping funnel, and a thermometer, 20 g of the novolak resin (hydroxyl group equivalent: 161 g/equivalent) obtained in Synthesis Example 11, 68.8 g of epichlorohydrin (0.74 mol), and 6.9 g of 1-butanol were charged, and heating was carried out to an internal temperature of 50° C. using a water bath. Then, 27.3 g (0.136 mol) of a 20% by mass sodium hydroxide aqueous solution was added dropwise into the flask over 2 hours. Then, the inside of the flask was kept at 50° C. for 1 hour to complete the reaction. After the reaction was completed, the organic layer was recovered by a liquid separation operation and concentrated with an evaporator to obtain a crude epoxy resin.

Into a 100 mL glass flask equipped with a stirrer and a thermometer, the above crude epoxy resin, 40.0 g of methyl isobutyl ketone, 7 g of 1-butanol, and 9.9 g of a 20% by mass sodium hydroxide aqueous solution were charged, and heating was carried out to an internal temperature of 80° C. with a water bath, thereby being subjected to an alkali treatment for 3 hours. Then, 82 g of methyl isobutyl ketone and 160 g of water were added, and the organic layer was recovered by a liquid separation operation and washed three times with 160 g of water. Then, the recovered organic layer was concentrated with an evaporator to obtain 40.0 g of a target epoxy resin. The epoxy equivalent was 209 g/equivalent.
[Physical Property Data]
Number average molecular weight (Mn)=773, weight average molecular weight (Mw)=6,367, polydispersity (Mw/Mn)=8.2

Synthesis Example K: Synthesis of Epoxy Resin Having Following Structural Unit

[Chemical 46]

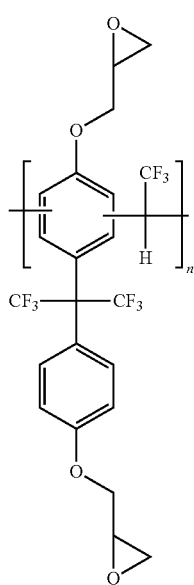

Into a 100 mL glass flask equipped with a stirrer, a dropping funnel, and a thermometer, 20 g of the novolak resin (hydroxyl group equivalent: 253 g/equivalent) obtained in Synthesis Example 12, 43.9 g of epichlorohydrin (0.47 mol), and 4.4 g of 1-butanol were charged, and heating was carried out to an internal temperature of 50° C. using a water bath. Then, 17.4 g (87 mmol) of a 20% by mass sodium hydroxide aqueous solution was added dropwise into the flask over 2 hours. Then, the inside of the flask was kept at 50° C. for 1 hour to complete the reaction. After the reaction was completed, the organic layer was recovered by a liquid separation operation and concentrated with an evaporator to obtain a crude epoxy resin.

Into a 300 mL glass flask equipped with a stirrer and a thermometer, the above crude epoxy resin, 40.0 g of methyl isobutyl ketone, 7 g of 1-butanol, and 12.5 g of a 20% by mass sodium hydroxide aqueous solution were charged, and heating was carried out to an internal temperature of 80° C. with a water bath, thereby being subjected to an alkali treatment for 4 hours. Then, 82 g of methyl isobutyl ketone and 160 g of water were added, and the organic layer was recovered by a liquid separation operation and washed three times with 160 g of water. Then, the recovered organic layer was concentrated with an evaporator to obtain 49.5 g of a target epoxy resin. The epoxy equivalent was 300 g/equivalent.
[Physical Property Data]
Number average molecular weight (Mn)=1,091, weight average molecular weight (Mw)=4,624, polydispersity (Mw/Mn)=4.2

(Preparation of Comparative Epoxy Resin)
A novolak epoxy resin having the following structural unit, manufactured by Sigma-Aldrich Co., LLC, was prepared. The epoxy equivalent was 225.
[Physical Property Data]
Number average molecular weight (Mn)=1,014, weight average molecular weight (Mw)=1,967, polydispersity (Mw/Mn)=2.824

[Chemical 47]

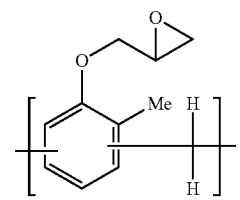

<Synthesis of Epoxy Acrylate>

Synthesis Example 7: Synthesis of Epoxy Acrylate Resin Solution Having Following Structural Unit

[Chemical 48]

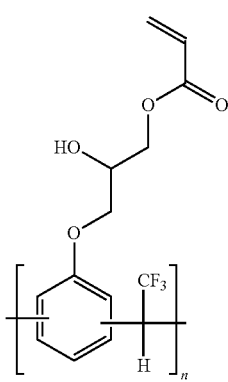

(16)

Novolak Resin Synthesis

In a 500 mL stainless steel autoclave reactor equipped with a pressure gauge, a thermometer protection tube, an insertion tube, and a stirring motor, 162 g (8.08 mol) of hydrogen fluoride and 125.2 g (1.33 mol) of phenol were placed. Then, while cooling with a water bath at 10° C., 178.2 g (fluoral: 1.00 mol, hydrogen fluoride: 3.92 mol) of the fluoral-containing mixture obtained in [Preparation example of fluoral] described above was introduced at an internal temperature of 10° C. to 13° C. over 33 minutes. Then, the temperature was raised to 25° C., and the reaction was carried out at an absolute pressure of 0.2 MPa for 27 hours. After completion of the reaction, the reaction solution was poured into 1.2 kg of ice water, and the organic substance was extracted with 820 g of diisopropyl ether. The organic layer recovered by the extraction operation was washed twice with 1.4 kg of water, and further, 600 g of water and 4 g of a 48% by mass potassium hydroxide aqueous solution were added thereto to be neutralized and washed. Then, washing was carried out twice with 600 g of water, and the organic layer was recovered by a liquid separation operation. The organic layer was concentrated with an evaporator to obtain 178.2 g of a novolak resin. The hydroxyl group equivalent of this novolak resin was 187 g/equivalent.

Epoxy Resin Synthesis

Into a 300 mL glass flask equipped with a stirrer, a dropping funnel, and a thermometer, 50 g of the novolak resin (hydroxyl group equivalent: 187 g/equivalent) obtained as described above, 148.2 g of epichlorohydrin (1.60 mol), and 15 g of 1-butanol were charged, and heating was carried out to an internal temperature of 50° C. with a water bath. Then, 58.7 g (0.291 mol) of a 20% by mass sodium hydroxide aqueous solution was added dropwise into the flask over 3 hours. Then, the inside of the flask was kept at 50° C. for 3 hours for reaction. After the reaction was completed, the organic layer was recovered by a liquid separation operation and washed with 148 g of water. Then, the organic layer was recovered by a liquid separation operation and concentrated with an evaporator to obtain a crude epoxy resin.

Into a 300 mL glass flask equipped with a stirrer and a thermometer, the above crude epoxy resin, 104 g of methyl isobutyl ketone, 17 g of 1-butanol, and 25 g of a 20% by mass sodium hydroxide aqueous solution were charged, and heating was carried out to an internal temperature of 80° C. with a water bath, thereby being subjected to an alkali treatment for 5 hours. Then, the organic layer was recovered by a liquid separation operation and concentrated with an evaporator to remove 1-butanol, and then 350 g of methyl isobutyl ketone was added, and washing was carried out 3 times with 200 g of water. Then, the organic layer was recovered by a liquid separation operation and concentrated with an evaporator to obtain 56.1 g of an epoxy resin. The epoxy equivalent was 254 g/equivalent.

Epoxy Acrylate Resin Solution Synthesis

Into a 100 mL glass flask equipped with a stirrer, a reflux condenser, and a thermometer, 38.8 g (epoxy equivalent: 254 g/equivalent) of the epoxy resin obtained as described above, 11.0 g (0.153 mol) of acrylic acid, 60 mg of hydroquinone, and 22.8 g of diethylene glycol monoethyl ether acetate were charged, and heating and stirring were carried out at an internal temperature of 100° C. using an oil bath to uniformly dissolve the mixture. Next, 170 mg of triphenylphosphine was charged thereinto, the temperature was raised to an internal temperature of 110° C., and the reaction was carried out for 2 hours while introducing dry air. Then, the temperature was raised to an internal temperature of 120° C., and the reaction was further carried out for 12 hours to complete the reaction. After cooling, a desired epoxy acrylate resin solution (I) was obtained.

[Physical Property Data]

Number average molecular weight (Mn)=2,076, weight average molecular weight (Mw)=5,768, polydispersity (Mw/Mn)=2.779, concentration of solid contents=68.7% by mass Synthesis Example 8: Synthesis of Acid-Modified Epoxy Acrylate Resin Solution Having Following Structural Unit

[Chemical 49]

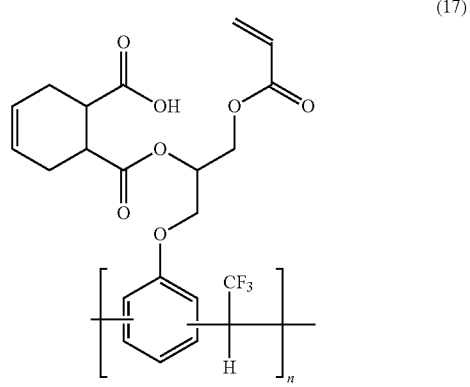

(17)

In a 100 mL glass flask equipped with a stirrer, a reflux condenser, and a thermometer, 54.6 g of the epoxy acrylate resin solution (I), 10.3 g of ortho-xylene, and 10.5 g (69.0 mmol) of 1,2,3,6-tetrahydrophthalic anhydride were placed. Then, while introducing dry air, heating was carried out to an internal temperature of 110° C. using an oil bath, and the reaction was carried out for 5 hours. After cooling, a desired acid-modified epoxy acrylate resin solution was obtained.

[Physical Property Data]

Number average molecular weight (Mn)=2,528, weight average molecular weight (Mw)=7,298, polydispersity (Mw/Mn)=2.887, solid content acid value=82 mgKOH/g, concentration of solid contents=63.7% by mass Synthesis Example 9: Synthesis of Epoxy Acrylate Resin Solution (II) Having Following Structural Unit

[Chemical 50]

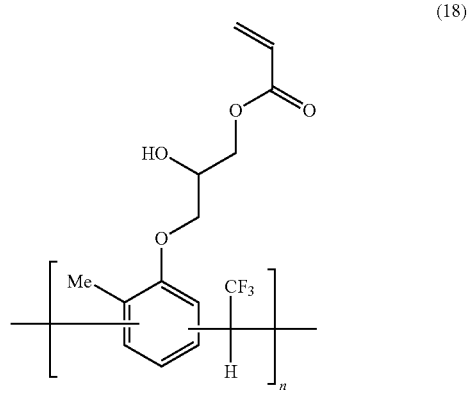

(18)

Novolak Resin Synthesis

In a 300 mL stainless steel autoclave reactor equipped with a pressure gauge, a thermometer protection tube, an insertion tube, and a stirring motor, 119.3 g (5.97 mol) of hydrogen fluoride and 89.7 g (0.829 mol) of 2-cresol were placed. Then, while cooling with a water bath at 2° C., 69.0 g (fluoral: 0.623 mol, hydrogen fluoride: 1.52 mol) of the fluoral-containing mixture obtained in [Preparation example of fluoral] described above was introduced at an internal temperature of 2° C. to 18° C. over 23 minutes. Then, the temperature was raised to 25° C., and the reaction was carried out at an absolute pressure of 0.2 MPa for 30 hours. Then, the same operation as in Synthesis Example 7 was carried out to obtain 120.4 g of novolak resin. The hydroxyl group equivalent of this novolak resin was 174 g/equivalent.

Epoxy Resin Synthesis

Into a 300 mL glass flask equipped with a stirrer, a dropping funnel, and a thermometer, 50 g of the novolak resin (hydroxyl group equivalent: 174 g/equivalent) obtained as described above, 159.5 g of epichlorohydrin (1.72 mol), and 16 g of 1-butanol were charged, and heating was carried out to an internal temperature of 50° C. using a water bath. Then, 63.2 g (0.318 mol) of a 20% by mass sodium hydroxide aqueous solution was added dropwise into the flask over 3 hours. Then, the same operation as in Synthesis Example 7 was carried out to obtain 58.9 g of an epoxy resin. The epoxy equivalent was 262 g/equivalent.

Epoxy Acrylate Resin Synthesis

Into a 100 mL glass flask equipped with a stirrer, a reflux condenser, and a thermometer, 38.8 g (epoxy equivalent: 262 g/equivalent) of the epoxy resin obtained as described above, 10.7 g (0.148 mol) of acrylic acid, 60 mg of hydroquinone, and 22.6 g of diethylene glycol monoethyl ether acetate were charged, and heating and stirring were carried out at an internal temperature of 100° C. using an oil bath to uniformly dissolve the mixture. Next, 170 mg of triphenylphosphine was charged thereinto, the temperature was raised to an internal temperature of 110° C., and the reaction was carried out for 2 hours while introducing dry air. Then, the temperature was raised to an internal temperature of 120° C., and the reaction was further carried out for 12 hours to complete the reaction. After cooling, a desired epoxy acrylate resin solution (II) was obtained.

[Physical Property Data]

Number average molecular weight (Mn)=1,185, weight average molecular weight (Mw)=2,075, polydispersity (Mw/Mn)=1.750

Synthesis Example 10: Synthesis of Acid-Modified Epoxy Acrylate Resin Solution Having Following Structural Unit

[Chemical 51]

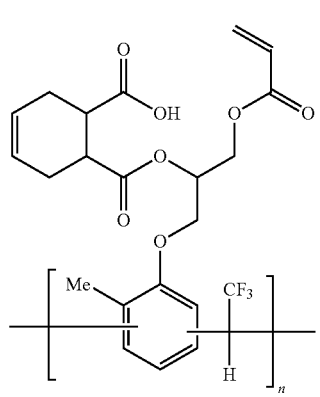

(19)

Acid-Modified Epoxy Acrylate Resin Synthesis

In a 100 mL glass flask equipped with a stirrer, a reflux instrument, and a thermometer, 56.0 g of the epoxy acrylate resin solution (II), 10.3 g of ortho-xylene, and 10.4 g (68.4 mmol) of 1,2,3,6-tetrahydrophthalic anhydride were placed. Then, while introducing dry air, heating was carried out to an internal temperature of 110° C. using an oil bath, and the reaction was carried out for 5 hours. By cooling, a desired acid-modified epoxy acrylate resin solution was obtained.

[Physical Property Data]

Number average molecular weight (Mn)=1,393, weight average molecular weight (Mw)=2,586, polydispersity (Mw/Mn)=1.856, solid content acid value=84 mgKOH/g, concentration of solid contents=63.7% by mass Comparative Synthesis Example 2: Synthesis of Acid-Modified Epoxy Acrylate Solution Having Following Structure

[Chemical 52]

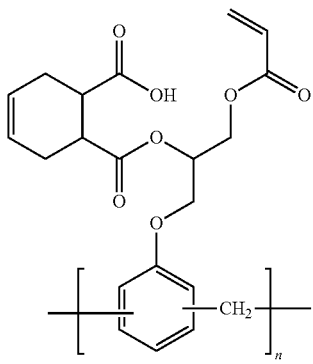

A resin solution of a compound having the above structure was obtained by the same operation as in Synthesis Example 7 and Synthesis Example 8 except that 50 g of phenol novolak (HF-1M manufactured by MEIWA PLASTIC INDUSTRIES. Ltd.) was used as the novolak resin.

[Physical Property Data]

Number average molecular weight (Mn)=2,187, weight average molecular weight (Mw)=10,158, polydispersity (Mw/Mn)=4.645, solid content acid value=91 mgKOH/g, concentration of solid contents=63.8% by mass Comparative Synthesis Example 3: Synthesis of Acid-Modified Epoxy Acrylate Solution Having Following Structure

[Chemical 53]

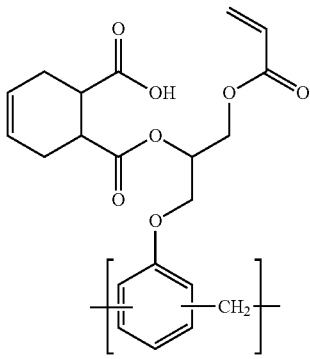

A resin solution of a compound having the above structure was obtained by the same operation as in Synthesis Example 9 and Synthesis Example 10 except that 50 g of cresol novolak (Phenolite KA-1160 manufactured by DIC Corporation) was used as the novolak resin.
[Physical Property Data]
Number average molecular weight (Mn)=1,385, weight average molecular weight (Mw)=2,559, polydispersity (Mw/Mn)=1.848, solid content acid value=85 mgKOH/g, concentration of solid contents=63.7% by mass Synthesis Example L: Synthesis of Epoxy Acrylate Resin Solution Having Following Structural Unit

[Chemical 54]

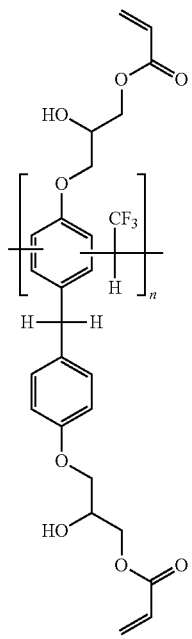

Into a 100 mL glass flask equipped with a stirrer, a reflux condenser, and a thermometer, 4.0 g (epoxy equivalent: 209 g/equivalent) of the epoxy resin obtained in Synthesis Example J, 1.4 g (19 mmol) of acrylic acid, 20 mg of hydroquinone, and 2.4 g of diethylene glycol monoethyl ether acetate were charged, and heating and stirring were carried out at an internal temperature of 110° C. using an oil bath to uniformly dissolve the mixture. Next, 21 mg of triphenylphosphine was charged thereinto, stirring was carried out for 2 hours while introducing dry air. Then, the temperature was raised to an internal temperature of 120° C., and stirring was further carried out for 8 hours to complete the reaction. After cooling, a desired epoxy acrylate resin solution was obtained.
[Physical Property Data]
Number average molecular weight (Mn)=1,040, weight average molecular weight (Mw)=6,192, polydispersity (Mw/Mn)=6.0, concentration of solid contents=69.1% by mass Synthesis Example M: Synthesis of Acid-Modified Epoxy Acrylate Resin Solution Having Following Structural Unit

[Chemical 55]

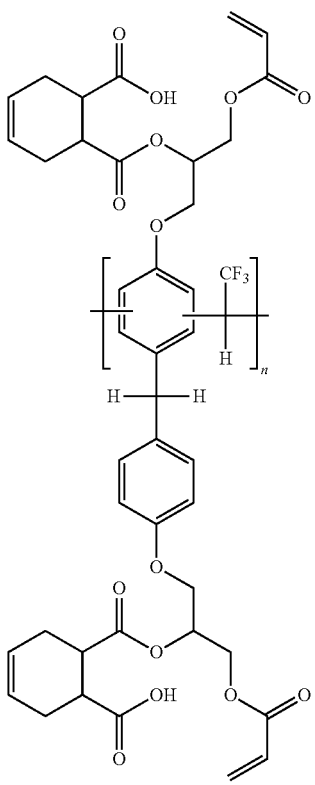

In a 100 mL glass flask equipped with a stirrer, a reflux instrument, and a thermometer, 10.0 g of the epoxy acrylate resin solution obtained in Synthesis Example L, 1.5 g of ortho-xylene, and 1.5 g (12 mmol) of 1,2,3,6-tetrahydrophthalic anhydride were placed. Then, while introducing dry air, heating was carried out to an internal temperature of 110° C. using an oil bath, and the reaction was carried out for 5 hours. By cooling, a desired acid-modified epoxy acrylate resin solution was obtained.
[Physical Property Data]
Number average molecular weight (Mn)=1,629, weight average molecular weight (Mw)=6,273, polydispersity (Mw/Mn)=3.9, solid content acid value 82 mgKOH/g, concentration of solid contents=63.2% by mass Synthesis Example N: Synthesis of Epoxy Acrylate Resin Solution Having Following Structural Unit

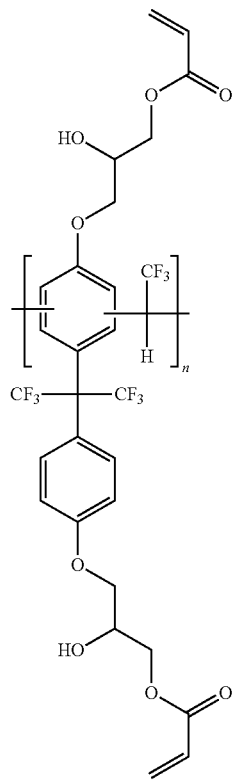

[Chemical 56]

Synthesis Example O: Synthesis of Acid-Modified Epoxy Acrylate Resin Solution Having Following Structural Unit

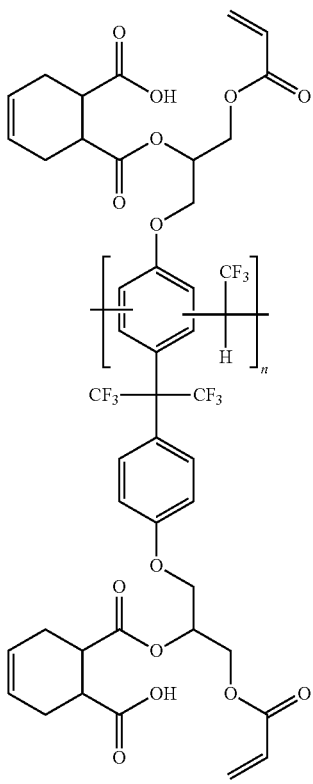

[Chemical 57]

Into a 100 mL glass flask equipped with a stirrer, a reflux condenser, and a thermometer, 5.0 g (epoxy equivalent: 300 g/equivalent) of the epoxy resin obtained in Synthesis Example K, 1.2 g (17 mmol) of acrylic acid, 31 mg of hydroquinone, and 3.8 g of diethylene glycol monoethyl ether acetate were charged, and heating and stirring were carried out at an internal temperature of 110° C. using an oil bath to uniformly dissolve the mixture. Next, 22 mg of triphenylphosphine was charged thereinto, stirring was carried out for 2 hours while introducing dry air. Then, the temperature was raised to an internal temperature of 120° C., and stirring was further carried out for 8 hours to complete the reaction. After cooling, a desired epoxy acrylate resin solution was obtained.

[Physical Property Data]

Number average molecular weight (Mn)=1,650, weight average molecular weight (Mw)=13,263, polydispersity (Mw/Mn)=8.0, concentration of solid contents=62.2% by mass In a 100 mL glass flask equipped with a stirrer, a reflux instrument, and a thermometer, 10.0 g of the epoxy acrylate resin solution obtained in Synthesis Example N, 1.5 g of ortho-xylene, and 1.5 g (10 mmol) of 1,2,3,6-tetrahydrophthalic anhydride were placed. Then, while introducing dry air, heating was carried out to an internal temperature of 110° C. using an oil bath, and the reaction was carried out for 8 hours. By cooling, a desired acid-modified epoxy acrylate resin solution was obtained.

[Physical Property Data]

Number average molecular weight (Mn)=1,725, weight average molecular weight (Mw)=24,333, polydispersity (Mw/Mn)=14.1, solid content acid value 67 mgKOH/g, concentration of solid contents=59.3% by mass.

<Preparation of Active Ester Resin>

Synthesis Example P: Synthesis of Active Ester Resin Having Following Structural Unit

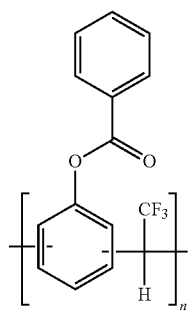

[Chemical 58]

Into a 100 mL glass flask equipped with a stirrer, a dropping funnel, and a thermometer, 10.0 g (hydroxyl group equivalent: 187 g/equivalent) of the novolak resin obtained in Synthesis Example 7, 7.6 g (54.1 mmol) of benzoyl chloride, 40.0 g of methyl isobutyl ketone, and 13 mg of tetrabutylammonium bromide were charged, and the internal temperature was set to 20° C. with a water bath. Then, 11.3 g (56.5 mmol) of a 20% by mass sodium hydroxide aqueous solution was added dropwise into the flask over 20 minutes. Then, the inside of the flask was kept at 20° C. for 1 hour to complete the reaction.

After the reaction was completed, 80 g of methyl isobutyl ketone and 80 g of water were added, and the organic layer was recovered by a liquid separation operation and washed twice with 80 g of water. Then, the recovered organic layer was concentrated with an evaporator to obtain 15.5 g of an active ester resin. The active ester equivalent was 291 g/equivalent.

Synthesis Example Q: Synthesis of Active Ester Resin Having Following Structural Unit

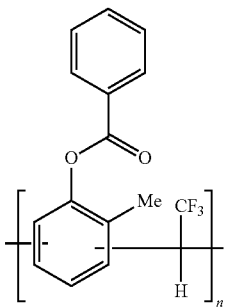

[Chemical 59]

Into a 100 mL glass flask equipped with a stirrer, a dropping funnel, and a thermometer, 10.0 g (hydroxyl group equivalent: 174 g/equivalent) of the novolak resin obtained in Synthesis Example 9, 8.3 g (59.0 mmol) of benzoyl chloride, 40.0 g of methyl isobutyl ketone, and 14 mg of tetrabutylammonium bromide were charged, and the internal temperature was set to 20° C. with a water bath. Then, 11.9 g (59.5 mmol) of a 20% by mass sodium hydroxide aqueous solution was added dropwise into the flask over 20 minutes. Then, the inside of the flask was kept at 20° C. for 1 hour to complete the reaction.

After the reaction was completed, 80 g of methyl isobutyl ketone and 80 g of water were added, and the organic layer was recovered by a liquid separation operation and washed twice with 80 g of water. Then, the recovered organic layer was concentrated with an evaporator to obtain 15.9 g of an active ester resin. The active ester equivalent was 278 g/equivalent.

<Evaluation of Absorbance>

The measurement was carried out using an ultraviolet-visible-near infrared spectrophotometer (UV-VIS-NIR SPECTROMETER, model name: UV-3150) manufactured by Shimadzu Corporation. Specifically, a 16% by mass propylene glycol monomethyl ether acetate solution of each novolak resin was introduced into a cell having an optical path length of 1 cm, and the absorbance of the g-line (wavelength: 436 nm), the h-line (wavelength: 405 nm), and the i-line (wavelength: 365 nm) was measured. The evaluation results are shown in the table below.

TABLE 1

| Novolak resin | Absorbance | | |
|---|---|---|---|
| | i-line Wavelength 365 nm | h-line Wavelength 405 nm | g-line Wavelength 436 nm |
| Synthesis Example 1 | 0.07 | 0.05 | 0.04 |
| Synthesis Example 2 | 1.84 | 0.30 | 0.12 |
| Synthesis Example 3 | 0.13 | 0.03 | 0.05 |
| Synthesis Example 4 | 2.67 | 2.66 | 0.71 |
| Synthesis Example 5 | 0.05 | 0.04 | 0.04 |
| Synthesis Example 6 | 0.13 | 0.08 | 0.07 |
| Comparative Synthesis Example 1 | 1.09 | 0.39 | 0.26 |

From the above table, it was shown that, particularly, the novolak resin corresponding to the case where n=0 in General Formula (1) exhibits a small absorbance with respect to the g-line, the h-line, and the i-line (allows this light to transmit well). That is, it can be said that the novolak resin of the first embodiment is preferably applicable to a photosensitive resin composition such as a photoresist.

<Evaluation of Alkali Solubility>

The procedure was as follows.

(1) The novolak resin obtained in Synthesis Example 2 was dissolved in PGMEA (propylene glycol monomethyl ether acetate) and then filtered through a filter having a pore size of 0.2 μm. As a result, a PGMEA solution of novolak resin was obtained. The amounts of novolak resin and PGMEA were adjusted so that the rate of the novolak resin in the solution was 20% by mass.

(2) The above PGMEA solution was applied onto the surface of an HMDS-treated silicon wafer by spin coating, and PGMEA was dried using a hot plate. In this way, a resin film was formed on the surface of the silicon wafer. Details of spin coating and drying conditions are as follows.

Spin coating conditions: a slope of 50 s, 1,000 rpm, 60 s
Drying conditions: 110° C., 60 s
Dried film thickness: 1 μm (3) The resin film formed in (2) described above was immersed in an alkaline aqueous solution (2.38% by mass tetramethylammonium hydroxide aqueous solution) together with the silicon wafer. Then, from the relationship between the immersion time and the film thickness, the alkali dissolution rate of the resin film formed of the novolak resin obtained in Synthesis Example 2 was calculated.

(4) The same procedure as (1) to (3) described above was carried out except that the novolak resin obtained in Comparative Synthesis Example 1 was used instead of the novolak resin obtained in Synthesis Example 2. From the above, the alkali dissolution rate of the resin film formed of the novolak resin obtained in Comparative Synthesis Example 1 was calculated.

As a result of the above evaluation, the alkali dissolution rate of the resin film formed of the novolak resin obtained in Synthesis Example 2 was 0.95 µm/s.

On the other hand, the alkali dissolution rate of the resin film formed of the novolak resin obtained in Comparative Synthesis Example 1 was 0.02 µm/s.

From the comparison of the above two results, it is understood that the novolak resin of the first embodiment has good alkali solubility.

<Preparation and Evaluation of Photosensitive Resin Composition (Photoresist Composition)>

A photosensitive resin composition (a photoresist composition) was prepared and evaluated by the following procedure.

(1) 75 parts by mass of the novolak resin obtained in Synthesis Example 2 and 25 parts by mass of a quinonediazide-based photosensitizing agent (NT200, manufactured by Toyo Gosei Co., Ltd.) were dissolved in 500 parts by mass of PGMEA (propylene glycol monomethyl ether acetate) and then subjected to filtration with a filter having a pore size of 0.2 µm. As a result, a photosensitive resin composition (a photoresist composition) was prepared.

(2) The photosensitive resin composition (the photoresist composition) was applied onto the surface of an HMDS-treated silicon wafer by spin coating, and PGMEA was dried using a hot plate. In this way, a photosensitive resin film (a photoresist film) was formed on the surface of the silicon wafer.

Spin coating conditions: a slope of 50 s, 1,000 rpm, 60 s
Drying conditions: 110° C., 60 s
Dried film thickness: 1 µm (3) A photomask having a line/space pattern of various widths was placed on the photosensitive resin film (the photoresist film) formed in (2) described above, and irradiated with light of 200 mJ/cm$^2$ using a g h i-line lamp (a device that emits the g-line, the h-line, and the i-line at the same time) is placed.

(4) The photosensitive resin film (the photoresist film) irradiated with light was immersed in a developer (a 1.19% by mass tetramethylammonium hydroxide aqueous solution) together with the silicon wafer for 60 seconds, thereby being subjected to development treatment. After the immersion, the resin film on the removed silicon wafer was dried by spraying nitrogen gas. In this way, a "pattern" was obtained on the silicon wafer.

The above "pattern" was observed with a microscope. As a result of the observation, it was confirmed that a pattern of line/space=5 µm/5 µm could be resolved. From this result, it is understood that the novolak resin of the first embodiment is preferably applied to a photosensitive resin composition that is used in the manufacture of electronic devices, such as a photoresist.

<Evaluation of Novolak Resin as "Curing Agent">

First, a curable resin composition was prepared by mixing the following components.

100 parts by mass of the novolak resin synthesized in Synthesis Example 1

Bisphenol A type epoxy resin (manufactured by Tokyo Chemical Industry Co., Ltd., epoxy equivalent: 189 g/eq)

Curing accelerator: 0.096 parts by mass of 1,2-dimethylimidazole 3 g of the curable resin composition was placed in a 51 mmφ aluminum cup container and placed on a hot plate. Then, it was heated at 180° C. for 10 minutes and then at 200° C. for 1.5 hours. As a result of the above, a cured substance could be obtained. That is, it was confirmed that the novolak resin of the first embodiment is capable of being used as a curing agent for the epoxy resin.

<Measurement of Transmittance (Solution)>

Using an ultraviolet-visible-near infrared spectrophotometer (UV-VIS-NIR SPECTROMETER, model name: UV-3150) manufactured by Shimadzu Corporation, a 20% by mass methyl ethyl ketone solution of the epoxy resin of Synthesis Example A was introduced into a cell having an optical path length of 1 cm, and the transmittance of light having a wavelength of 400 nm (visible light) and light having a wavelength of 365 nm (near-ultraviolet rays) was measured. The transmittance (solution) of the epoxy resin of Synthesis Example B and the comparative epoxy resin was measured in the same manner.

The results are collectively shown in the table below.

TABLE 2

| Epoxy resin | Structural unit | Transmittance (%) 400 nm | 365 nm |
|---|---|---|---|
| Synthesis Example A | [structure with CF$_3$ and H] | 80 | 57 |
| Synthesis Example B | [structure with Me, CF$_3$ and H] | 75 | 46 |
| For comparison | [structure with Me and H, H] | 58 | 12 |

As shown in the above table, the epoxy resin of the second embodiment has good transmittance of visible light and near-ultraviolet rays.

<Measurement of Total Chlorine Amount>

The total chlorine amount of the epoxy resin of Synthesis Example A was measured based on JIS K 7243-3: 2005. As a result of the measurement result, it was 533 ppm. That is, the total chlorine amount of the epoxy resin of the second embodiment was sufficiently small.

<Preparation of Curable Resin Composition, and Preparation and Evaluation of Cured Substance>

Using the epoxy resin of Synthesis Example A, the epoxy resin of Synthesis Example B, and the comparative epoxy resin, each curable resin composition having the composition shown in the table below was prepared.

In the table below, the unit of numerical values is the part by mass.

In the table below, the curing agent is methylhexahydrophthalic anhydride (acid anhydride equivalent: 165 g/equivalent, liquid at room temperature), and the curing accelerator is tributyl (ethyl)phosphonium diethylphosphate (liquid at room temperature). The curable resin composition obtained by mixing each component while heating has a liquid shape (solvent-free varnish).

TABLE 3

| Component | Example 1 | Example 2 | Comparative Example 1 |
|---|---|---|---|
| Epoxy resin of Synthesis Example A | 100 | — | — |
| Epoxy resin of Synthesis Example B | — | 100 | — |
| Comparative epoxy resin | — | — | 100 |
| Curing agent | 53 | 42 | 73 |
| Curing accelerator | 0.5 | 0.4 | 0.7 |

3 g of the prepared curable resin composition was placed in a 51 mmφ aluminum cup container and stirred at 100° C. for about 3 minutes to make it uniform. Then, using a hot plate, it was heated at 100° C. for 3 hours and then further heated at 140° C. for 3 hours. From the above, a cured substance for evaluation, having a thickness of 1 mm, was obtained.

Measurement of Glass Transition Temperature

The glass transition temperature of each cured substance was measured by a differential scanning calorimeter. The glass transition temperature was measured using a differential scanning calorimeter (manufactured by Hitachi High-Tech Science Corporation, model name: DSC7000) under the condition of a heating rate of 10° C./min.

Measurement of Transmittance (Cured Substance)

Using an ultraviolet-visible-near infrared spectrophotometer (UV-VIS-NIR SPECTROMETER, model name: UV-3150) manufactured by Shimadzu Corporation, the cured substance was subjected to the measurement of the transmittance of light having a wavelength of 400 nm (visible light) and light having a wavelength of 365 nm (near-ultraviolet rays).

The results are collectively shown in the table below.

TABLE 4

| | | Example 1 | Example 2 | Comparative Example 1 |
|---|---|---|---|---|
| Evaluation | Glass transition temperature (° C.) | 163 | 157 | 176 |
| | Transmittance (%) 400 nm | 85 | 76 | 65 |
| | 365 nm | 74 | 62 | 26 |

From the above table, the glass transition temperature of the cured substances of Examples 1 and 2 produced using the fluorine-containing epoxy resin having a partial structure represented by —C(CF$_3$)H— is about the same as the glass transition temperature of the cured substance of Comparative Example 1 produced using the comparative epoxy resin which is fluorine-free. From this result, it can be said that the epoxy resin of the second embodiment suppresses excessive rigidity although it contains a fluorine atom.

In addition, good transparency of visible light and near-ultraviolet rays was confirmed not only in the resin solution but also in the cured substance.

Comparison of Solvent Solubility of Epoxy Resin

30% by mass solutions of the epoxy resin obtained in Synthesis Example 13 and the comparative epoxy resin were prepared by using the solvents shown in the table below. Then, the solutions were allowed to stand at room temperature for 1 day. The state of the solutions after being allowed to stand for 1 day was visually observed, and a uniform solution was evaluated as having good solubility (A), and a solution in which precipitation or separation occurred was evaluated as having poor solubility (B).

TABLE 5

| | Solubility | |
|---|---|---|
| Solvent | Epoxy resin of Synthesis Example B | Comparative epoxy resin |
| Methanol | A | B |
| Butyl cellosolve | | |
| Methyl ethyl ketone | A | B |
| Methyl isobutyl ketone | | |
| Tetrahydrofuran | | |
| Propylene glycol monomethyl ether acetate | | |
| Ethyl acetate | | |
| Chloroform | | |
| Toluene | | |

As shown in the table above, the epoxy resin of Synthesis Example B exhibited good solubility in various organic solvents. On the other hand, in the evaluation using the comparative epoxy resin, the result of poor solubility in alcoholic solvents such as methanol and butyl cellosolve was obtained.

<Photosensitive Resin Composition>

Using the resin solutions of Synthesis Examples 8 and 10 and Comparative Synthesis Examples 2 and 3, each component was blended in the proportions shown in Table 6 below and then stirred and mixed until the resultant mixture became uniform, and a photosensitive resin composition for solder resist was prepared. Table 7 shows the physical properties of each composition and the cured substance thereof.

TABLE 6

| | Example 3 | Example 4 | Comparative Example 2 | Comparative Example 3 |
|---|---|---|---|---|
| Synthesis Example 8 | 100 parts by mass | | | |
| Synthesis Example 10 | | 100 parts by mass | | |
| Comparative Synthesis Example 2 | | | 100 parts by mass | |
| Comparative Synthesis Example 3 | | | | 100 parts by mass |
| Epoxy resin [1] | 40 parts by mass | 40 parts by mass | 40 parts by mass | 40 parts by mass |
| Photopolymerization initiator [2] | 1 part by mass | 1 part by mass | 1 part by mass | 1 part by mass |

[1] Epoxy resin: EOCN-1020-55 (manufactured by Nippon Kayaku Co., Ltd.)
[2] Photopolymerization initiator: Irgacure OXE02 (manufactured by BASF Japan Ltd.)

TABLE 7

|  | Example 3 | Example 4 | Comparative Example 2 | Comparative Example 3 |
| --- | --- | --- | --- | --- |
| Patterning | A | A | B | A |
| Glass transition temperature (° C.) | 206 | 232 | 195 | 218 |
| Coefficient of linear thermal expansion (ppm/K) | 210 | 141 | 232 | 140 |
| Elongation rate (%) | 4.1 | 2.9 | 3.7 | 2.3 |
| Tensile elastic modulus (GPa) | 2.3 | 2.5 | 2.4 | 2.8 |
| Tensile stress (MPa) | 65.7 | 59.2 | 61.9 | 56.5 |

The sample preparation and the test method in the performance test shown in Table 7 above are as follows.

<Production of Photosensitive Resin Film>

Each of the photosensitive resin compositions of Examples 3 and 4 and Comparative Examples 2 and 3 was applied using a bar coater onto a glass substrate of which the surface had been treated with ozone for 1 minute, drying was carried out at 80° C. for 30 minutes using a hot plate, and then cooling was carried out to room temperature to produce a photosensitive resin film.

Evaluation of Patterning

The above photosensitive resin film was exposed to the i-line using an exposure machine (manufactured by SUSS MicroTec SE) through a photomask under the condition of an exposure amount of 2 J/cm$^2$ and then immersed in a 1% Na$_2$CO$_3$ aqueous solution for 45 minutes. Then, it was washed with ultrapure water, dried with an N$_2$ blow, and heated at 150° C. for 1 hour using a hot plate to obtain an evaluation sample. The obtained sample was observed using an optical microscope, and the collapse in patterning was evaluated. The evaluation criteria are as follows.

A: No pattern collapse is observed
B: Partial pattern collapse is observed
C: Overall pattern collapse is observed <Production of Cured Substance of Photosensitive Resin>

The above-described photosensitive resin film was exposed under the condition of an exposure amount of 2 J/cm$^2$ by using an LED exposure machine (H-20AH4-FS1 manufactured by HOYA Corporation) and then heated at 150° C. for 1 hour using a hot plate. After peeling the obtained cured substance from the glass substrate, it was cut out to a predetermined size and used for the evaluation of the glass transition temperature, the coefficient of linear thermal expansion, and the mechanical strength.

<Measurement of Glass Transition Temperature>

The measurement was carried out using a differential scanning calorimeter (DSC7000 manufactured by Hitachi High-Tech Science Corporation) under the conditions of a sample amount of about 10 mg, a heating rate of 5° C./min, and a nitrogen atmosphere.

<Measurement of Coefficient of Linear Thermal Expansion>

A sample obtained by cutting the cured substance into 20 mm×5 mm was used. Using a thermomechanical analysis device (TMA8310, manufactured by Rigaku Corporation), measurements were successively carried out twice according to a tensile load method under the conditions of a load of 98 mN and a heating rate of 10° C./min. The average coefficient of linear thermal expansion from 50° C. to 150° C. in the second measurement was calculated.

<Measurement of Mechanical Strength>

A sample obtained by cutting the cured substance into 60 mm×5 mm was used. Elongation rate, tensile elastic modulus, and tensile stress were measured according to JIS K7127.

From the results shown in Table 7, the photosensitive resin composition of Example 3 has good patterning as compared with the photosensitive resin composition of Comparative Example 2. In addition, it is conceived that the cured substance of the photosensitive resin composition of Example 3 has a small coefficient of linear thermal expansion as compared with the cured substance of the photosensitive resin composition of Comparative Example 2, and it is excellent in dimensional stability. Further, since the cured substances of the photosensitive resin compositions of Examples 3 and 4 have a high glass transition point, have a large elongation rate, and have a low modulus of elasticity, as compared with the cured substances of the photosensitive resin compositions of Comparative Example 2 and Comparative Example 3, respectively, it is conceived that they are excellent in heat resistance and crack resistance, and it is understood that they are suitable for the use application to solder resist or the use application to imprint.

<Preparation and Evaluation of Curable Resin Composition Using Active Ester Resin>

First, a curable resin composition having the composition shown in Table 8 was prepared.

TABLE 8

| Component | Example 5 |
| --- | --- |
| Active ester resin of Synthesis Example P | 100 parts by mass |
| Bisphenol A type epoxy resin | 65 parts by mass |
| Curing accelerator | 0.8 parts by mass |
| Solvent | 89 parts by mass |

In the above table, the bisphenol A type epoxy resin, the curing accelerator, and the solvent are as follows.

Bisphenol A type epoxy resin: a product made by Tokyo Chemicals, epoxy equivalent: 189 g/equivalent
Curing accelerator: 4-dimethylaminopyridine
Solvent: methyl ethyl ketone 1 g of the prepared curable resin composition was placed in a 51 mmφ aluminum cup and heated at 120° C. for 1 hour to evaporate the solvent using a hot plate, and then heated at 200° C. for 2 hours. From the above, a cured substance was obtained.

The glass transition temperature of the cured substance was measured with a differential scanning calorimeter. DSC7000 manufactured by Hitachi High-Tech Science Corporation was used as the differential scanning calorimeter, and the measurement was carried out under the condition of a heating rate of 10° C./min. The glass transition temperature of the cured substance of Example 5 was 85° C.

This application claims priority based on Japanese Patent Application No. 2020-057369 filed on Mar. 27, 2020, Japanese Patent Application No. 2020-078271 filed on Apr. 27, 2020, and Japanese Patent Application No. 2020-164681 filed on Sep. 30, 2020, and all contents of the disclosures are incorporated herein.

The invention claimed is:

1. A novolak resin comprising a partial structure represented by —C(CF$_3$)H—, and
wherein the novolak resin has a structural unit represented by General Formula (1),

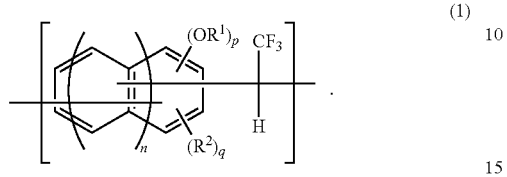

in General Formula (1),
R$^1$ represents a hydrogen atom or a monovalent organic group, and in a case where a plurality of R$^1$'s are present, the plurality of R$^1$'s may be the same or different from each other,
R$^2$ represents a monovalent substituent, and in a case where a plurality of R$^2$'s are present, the plurality of R$^2$'s may be the same or different from each other,
n is 0 to 2, and
p is 1 or more, and q is 0 or more, provided that in a case where n is 0, p+q≤4 is satisfied, in a case where n is 1, p+q≤6 is satisfied, and in a case where n is 2, p+q≤8 is satisfied, and
wherein the novolak resin has at least one structural unit selected from the group consisting of General Formulae (8), (10), and (11),

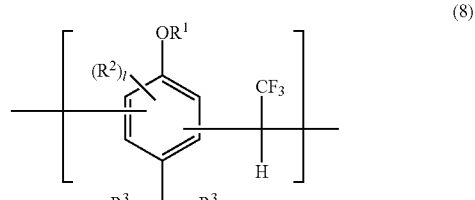

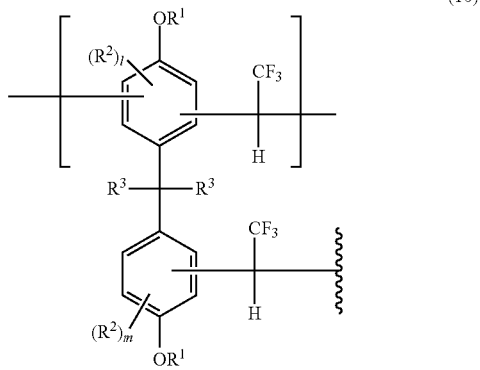

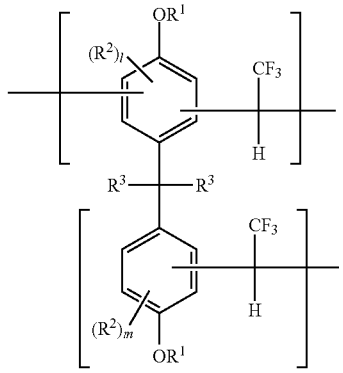

in General Formulae (8), (10), (11),
R$^1$ represents a hydrogen atom or a monovalent organic group, and in a case where a plurality of R$^1$'s are present, the plurality of R$^1$'s may be the same or different from each other,
R$^2$ represents a monovalent substituent, and in a case where a plurality of R$^2$'s are present, the plurality of R$^2$'s may be the same or different from each other,
l and m are each independently 0 to 3,
R$^3$ represents a hydrogen atom, an alkyl group, an alkenyl group, or an aryl group, these groups may be further substituted with a fluorine atom, and R$^3$ may be linked to form a cyclic group having 3 to 10 carbon atoms, the cyclic group being saturated or unsaturated, and monocyclic or polycyclic, and in a case where a plurality of R$^3$'s are present, the plurality of R$^3$'s may be the same or different from each other.

2. The novolak resin according to claim 1, wherein n=0 is satisfied.

3. The novolak resin according to claim 1, wherein R$^1$ contains a polymerizable carbon-carbon double bond.

4. The novolak resin according to claim 1, wherein the novolak resin further has a partial structure represented by General Formula (12),

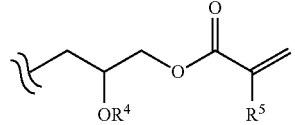

in General Formula (12), R$^4$ represents a hydrogen atom or a monovalent organic group, and R$^5$ represents a hydrogen atom, a methyl group, or a fluorine atom.

5. The novolak resin according to claim 4, wherein R$^4$ represents a group having a terminal carboxy group.

6. The novolak resin according to claim 1, wherein the novolak resin has a structural unit represented by Formula (2),

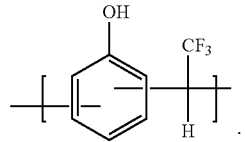

7. The novolak resin according to claim 1, wherein the novolak resin has a structural unit represented by Formula (3),

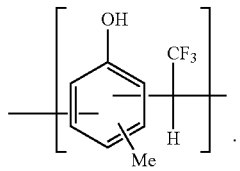
(3)

8. The novolak resin according to claim 1, wherein the novolak resin has a structural unit represented by General Formula (25),

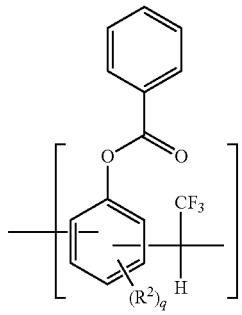
(25)

in General Formula (25),

R² represents a monovalent substituent, and in a case where a plurality of R²'s are present, the plurality of R²'s are may be the same or different from each other, and q is 0 to 3.

9. The novolak resin according to claim 1, wherein the novolak resin has at least one structural unit selected from the group consisting of General Formulae (13), (14), and (15),

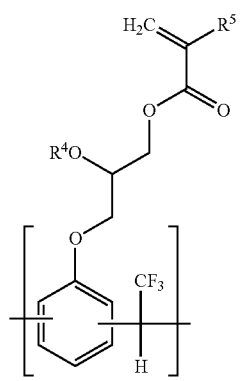
(13)

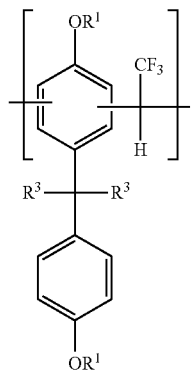
(14)

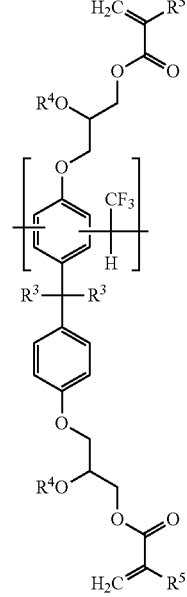
(15)

in General Formulae (13) to (15),

R¹ represents a hydrogen atom or a monovalent organic group, and in a case where a plurality of R¹'s are present, the plurality of R¹'s may be the same or different from each other, R³ represents a hydrogen atom, an alkyl group, an alkenyl group, or an aryl group, these groups may be further substituted with a fluorine atom, and R³ may be linked to form a cyclic group having 3 to 10 carbon atoms, the cyclic group being saturated or unsaturated, and monocyclic or polycyclic, and in a case where a plurality of R³'s are present, the plurality of R³'s may be the same or different from each other, R⁴ represents a hydrogen atom or a monovalent organic group, and R⁵ represents a hydrogen atom, a methyl group, or a fluorine atom.

10. A photosensitive resin composition comprising: the novolak resin according to claim 1; and a photosensitizing agent.

11. A curable resin composition comprising the novolak resin according to claim 1.

12. A cured substance obtained by curing the curable resin composition according to claim 11.

13. An electronic device comprising the cured substance according to claim 12.

14. A production method for a novolak resin, comprising reacting an aromatic compound with fluoral in a presence of an acid catalyst to produce a novolak resin having a partial structure represented by —C(CF$_3$)H—, and wherein the novolak resin has a structural unit represented by General Formula (1),

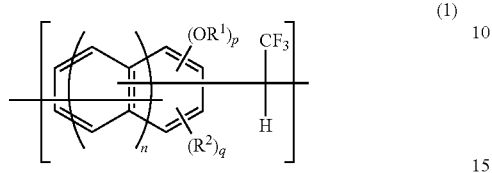
(1)

in General Formula (1),

R$^1$ represents a hydrogen atom or a monovalent organic group, and in a case where a plurality of R$^1$'s are present, the plurality of R$^1$'s may be the same or different from each other, R$^2$ represents a monovalent substituent, and in a case where a plurality of R$^2$'s are present, the plurality of R$^2$'s are may be the same or different from each other, n is 0 to 2, and p is 1 or more, and q is 0 or more, provided that in a case where n is 0, p+q≤4 is satisfied, in a case where n is 1, p+q≤6 is satisfied, and in a case where n is 2, p+q≤8 is satisfied, and wherein the novolak resin has at least one structural unit selected from the group consisting of General Formulae (8), (10), and (11),

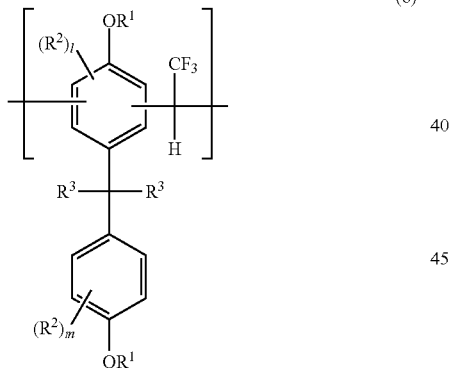
(8)

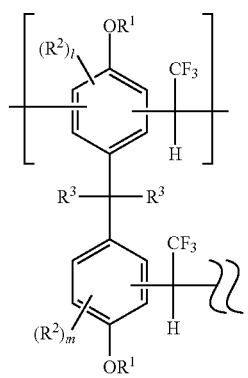
(10)

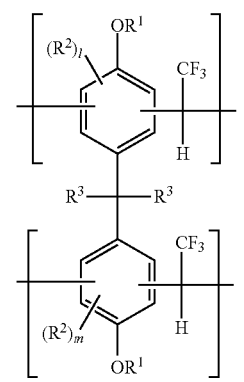
(11)

in General Formulae (8), (10), (11),

R$^1$ represents a hydrogen atom or a monovalent organic group, and in a case where a plurality of R$^1$'s are present, the plurality of R$^1$'s may be the same or different from each other, R$^2$ represents a monovalent substituent, and in a case where a plurality of R$^2$'s are present, the plurality of R$^2$'s may be the same or different from each other, l and m are each independently 0 to 3, R$^3$ represents a hydrogen atom, an alkyl group, an alkenyl group, or an aryl group, these groups may be further substituted with a fluorine atom, and R$^3$ may be linked to form a cyclic group having 3 to 10 carbon atoms, the cyclic group being saturated or unsaturated, and monocyclic or polycyclic, and in a case where a plurality of R$^3$'s are present, the plurality of R$^3$'s may be the same or different from each other.

* * * * *